United States Patent
Zou

(10) Patent No.: US 7,317,357 B1
(45) Date of Patent: Jan. 8, 2008

(54) HIGH LINEARITY LOW NOISE VARIABLE GAIN AMPLIFIER WITH CONTINUOUS GAIN CONTROL

(75) Inventor: Min Z. Zou, San Jose, CA (US)

(73) Assignee: Linear Technology Corporation, Milpitas, CA (US)

(*) Notice: Subject to any disclaimer, the term of this patent is extended or adjusted under 35 U.S.C. 154(b) by 57 days.

(21) Appl. No.: 11/473,331

(22) Filed: Jun. 23, 2006

(51) Int. Cl.
*H03F 3/45* (2006.01)

(52) U.S. Cl. .................... 330/254; 330/278

(58) Field of Classification Search ........... 330/254, 330/278, 261, 252
See application file for complete search history.

(56) References Cited

U.S. PATENT DOCUMENTS

| | | | |
|---|---|---|---|
| 5,077,541 A | 12/1991 | Gilbert | |
| 5,313,172 A * | 5/1994 | Vagher | 330/254 |
| 5,619,169 A * | 4/1997 | Matsuura | 330/254 |
| 7,262,661 B2 * | 8/2007 | Zou | 330/256 |

FOREIGN PATENT DOCUMENTS

EP  0 234 655 A1  9/1987

OTHER PUBLICATIONS

International Search Report issued in corresponding International Patent Application No. PCT/US2006/043965 dated Mar. 15, 2007.
Van Lieshout, P.J.G, et al., "A Power-Efficient, Low-Distortion Variable Gain Amplifier Consisting of Coupled Differential Pairs", IEEE Journal of Solid-State Circuits, Dec. 1997, pp. 2105-2110, vol. 32 No. 12, IEEE.

* cited by examiner

*Primary Examiner*—Henry Choe
(74) *Attorney, Agent, or Firm*—McDermott Will & Emery LLP

(57) ABSTRACT

A variable gain amplifier comprises a plurality of serially connected transistor cells, in which each of the transistor cells has a plurality of connecting terminals. The first terminals of the transistor cells are serially coupled together to receive a first input voltage. The second terminals of the transistor cells are serially connected via a first set of resistors between adjacent cells and coupled to a first gain control. Each of the second terminals is AC or virtual grounded. The third terminals of the transistor cells are coupled together to supply a positive current output. The fourth terminals of the transistor cells are coupled together to supply a negative current output.

28 Claims, 19 Drawing Sheets

HIGH LINEARITY LOW NOISE VARIABLE GAIN AMPLIFIER WITH CONTINUOUS GAIN CONTROL

TECHNICAL FIELD

The subject matter presented herein relates to a variable gain amplifier, and more particularly to an improved variable gain amplifier that provides high linearity, low noise performance at a wider frequency bandwidth with continuous gain control.

BACKGROUND

A variable gain amplifier (VGA) is used in a wide range of communication systems. Due to its frequent use in a variety of situations, it is desirable for a VGA to have features in order to maintain a good dynamic range across a full gain control range. For example, desirable characteristics of a VGA include high linearity, low noise, low DC power consumption, linear-in-dB gain control, high frequency operation, and gain setting independent of temperature.

FIG. 1 (Prior Art) illustrates a conventional multi-stage VGA 100. The VGA 100 receives inputs +Vin/2 and −Vin/2 and provides outputs Iout+ and Iout−. The inputs are applied to the bases of transistors 10 and 36, respectively, which have their emitters coupled to ground through respective current sources. Connected in series between transistor 10 and ground are resistors 24-34 and a current gain control (GC) 24. Connected in series between transistor 36 and ground are resistors 48-58 and a different current gain control 72.

Connected between Iout+ and Iout− are six differential pairs of transistors. The emitters of a first differential pair of transistors 10 and 46 are connected together. The emitters of a second differential pair of transistors 12 and 44 are connected together. The emitters of a third differential pair of transistors 14 and 42 are connected together. The emitters of a fourth differential pair of transistors 16 and 40 are connected together. The emitters of a fifth differential pair of transistors 18 and 38 are connected together. The emitters of a sixth differential pair of transistors 20 and 36 are connected together. Each of the transistor emitters has a tail current source. For example, the first differential pair has a tail current source 60. The second differential pair has a tail current source 62. The third differential pair has a tail current source 64. The fourth differential pair has a tail current source 66. The fifth differential pair has a tail current source 68. The sixth differential pair has a tail current source 70.

The base of transistor 12 is connected to the junction between resistors 24 and 26. The base of transistor 14 is connected to the junction between resistors 26 and 28. The base of transistor 16 is connected to the junction between resistors 28 and 30. The base of transistor 18 is connected to the junction between resistors 30 and 32. The base of transistor 20 is connected to the junction between resistors 32 and 34. The base of transistor 38 is connected to the junction between resistors 48 and 50. The base of transistor 40 is connected to the junction between resistors 50 and 52. The base of transistor 42 is connected to the junction between resistors 52 and 54. The base of transistor 44 is connected to the junction between resistors 54 and 56. The base of transistor 46 is connected to the junction between resistors 56 and 58.

Input voltages +Vin/2 and −Vin/2 are delivered to the bases of the transistors 10-46 in different versions that are shifted in accordance with the voltage drops across resistors 24-58. If the resistances of all resistors are equal (R), an offset voltage exists between the bases of each differential pair of transistors. The offset for the first pair is equal to the difference between the input voltage at the base of transistor 10 and the voltage drops across the five resistors 48 through 56, or proportional to 5×R. The offsets for the second through sixth pairs are proportional to 3×R, R, R, 3×R and 5×R, respectively. The offset for each pair is designated to be $R_i$, wherein i represents the number of the differential pairs.

With zero gain control currents in the resistor paths, all differential pairs operate without any offset and maximum gain is obtained. Increasing the gain control current will produce different offsets across the individual pairs, thereby downwardly adjusting the gain. The gain with respect to control current is represented by the following relationship:

$$I_{out}(V_{in}) = \alpha_F * I_{ptat} * \sum_{i=1}^{n} \tanh\frac{V_{in} - \varphi_i}{2V_T} \quad (1)$$

$$\varphi_i / (R \cdot GC) = n-1, n-3, \ldots, -(n-3), -(n-1)$$

$$\text{for } i = 1, 2, \ldots, n-1, n$$

Where $I_{ptat}$ is the differential pair tail current, $\alpha_F$ is the ratio between the collector and emitter current of the corresponding transistors, $V_T$ is the thermal voltage, and $\psi_i$ is the DC offset of the differential pair i. The transconductance can be derived by differentiating $I_{out}$ with respect to $V_{in}$.

$$gm(V_{in}) = \frac{\alpha_F * I_{ptat}}{2V_T} * \sum_{i=1}^{n} \text{sech}^2 \frac{V_{in} - \varphi_i}{2V_T} \quad (2)$$

FIG. 2 shows plots of transconductance of VGA 100 with respect to the input voltage, wherein the X axis represents the input voltage and the Y axis represents gm. Different curves 205, 210, 215, 220, 225, and 230 correspond to gm measured with respect to different gain control currents (GCs). The most sharp curve corresponds GC=0. The curve marked with a diamond symbol corresponds to GC=60. The curve marked with a downward triangle symbol corresponds to GC=120. The curve marked with a upward triangle symbol corresponds to GC=180. The curve marked with a square symbol corresponds to GC=240. The curve marked with a "+" symbol corresponds to GC=300. As the gain control current GC increases, gm decreases or the gain becomes smaller. In addition, when gm decreases, gm is linear across a wider range of input voltage. That is, the linearity of the VGA 100 improves as the gain is lower.

In the VGA 100, the resistors 24-58 present along the signal path may significantly degrade the VGA's performance. For example, the bandwidth and the high frequency operation of the VGA may be negatively affected. In addition, the presence of these resistors may degrade the noise performance of the VGA 100. Even though the bandwidth of the VGA 100 may be compensated by employing a low resistance and a high GC current, the high degree of noise caused by the high GC current may degrade the VGA's performance. Furthermore, the high GC current also increases the DC power consumption, which is undesirable. This is shown in FIG. 3a, which shows the VGA's gain and its input referred noise with respect to frequency under different control currents. In FIG. 3a, the X axis represents frequency. The Y axis of the upper portion of FIG. 3a represents the amplitude of the noise. The Y axis of the lower portion of FIG. 3a represents the amount of gain measured. Different curves in each plot correspond to different gain control current. The top curve marked with a square symbol corresponds GC=0. The curve marked with a diamond symbol corresponds to GC=60. The curve marked with a downward triangle symbol corresponds to GC=120. The curve marked with a upward triangle symbol corresponds to GC=180. The curve marked with a square symbol corresponds to GC=240. The curve marked with a "+" symbol corresponds to GC=300. As can be seen, when the control current is higher, the VGA's gain decreases. When the frequency increases, the VGA's gain also decreases.

In addition, the VGA's performance is also affected by temperature. As evident from equation (2), transconductance is a function of thermal voltage $V_T$, which varies with temperature. $V_T$ is an element in the denominator of two parts of the gain equation. Thus, in the known amplifier gain stage of FIG. 1, gain is variable with temperature. FIG. 3b shows plots of linearity-in-dB and gain with respect to gain control current GC. The linearity error and the gain are relatively linear in the central range, of approximately 0.4 m to 0.6 m, while having an increasing error in linearity through the range above 0.6 m. The plot of linearity-in-dB exhibits curvature, the extent of which can be appreciated in FIG. 3b. To have a VGA that maintains quality high frequency operation, high linearity, low DC power consumption, linear-in-dB gain control, and robust performance against noise, and gain setting independent of temperature, an improved VGA is needed.

SUMMARY

The present teaching describes a variable gain amplifier. The variable gain amplifier described herein comprises a plurality of serially connected transistor cells, each of which has a plurality of connecting terminals, through which the transistors are connected. First terminals of the transistor cells are serially coupled together to receive an input voltage. Second terminals of the transistor cells are serially connected via a set of resistors positioned between adjacent transistor cells and coupled together to a gain control. Each of the second terminals is coupled to an AC ground or a virtual ground. Third terminals of the transistor cells are coupled together and to a positive current output node. Fourth terminals of the transistor cells are coupled together and to a negative current output node.

In accordance with another aspect, the variable gain amplifier comprises a plurality of serially connected transistor cells and a dynamic base current compensation unit, that has a plurality of components, each of which corresponds to a respective one of the transistor cells. The serially connected transistor cells receive an input voltage and are coupled to a gain control, a positive current output node, and a negative current output node. Each of the transistors is coupled to a corresponding component in the dynamic base current compensation unit to receive a dynamically compensated base current.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

Figure 4A:
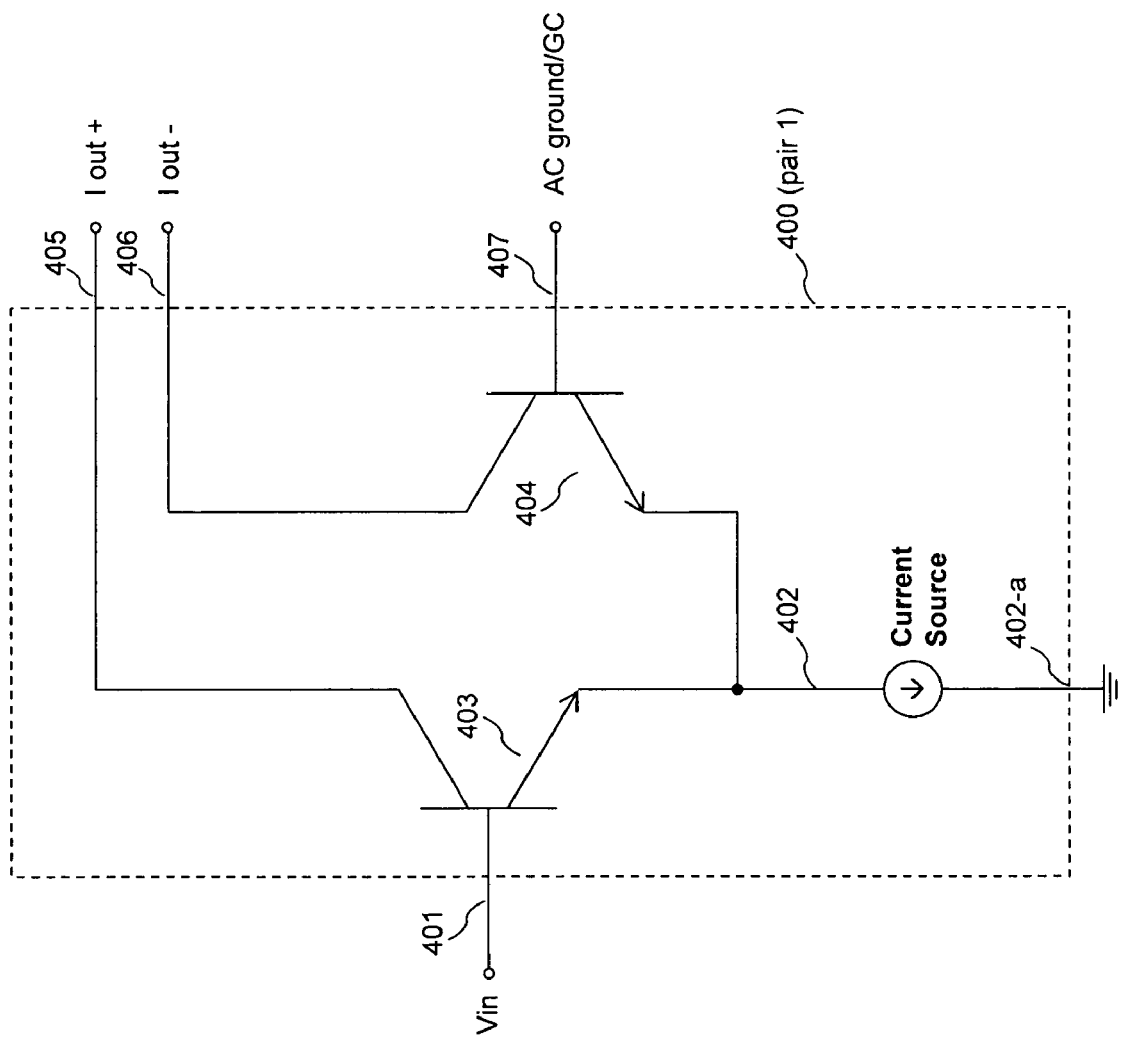
FIG. 4a depicts an exemplary circuit using a pair of transistors to form a quasi differential pair, according to an embodiment of the present invention.
Figure 4B:
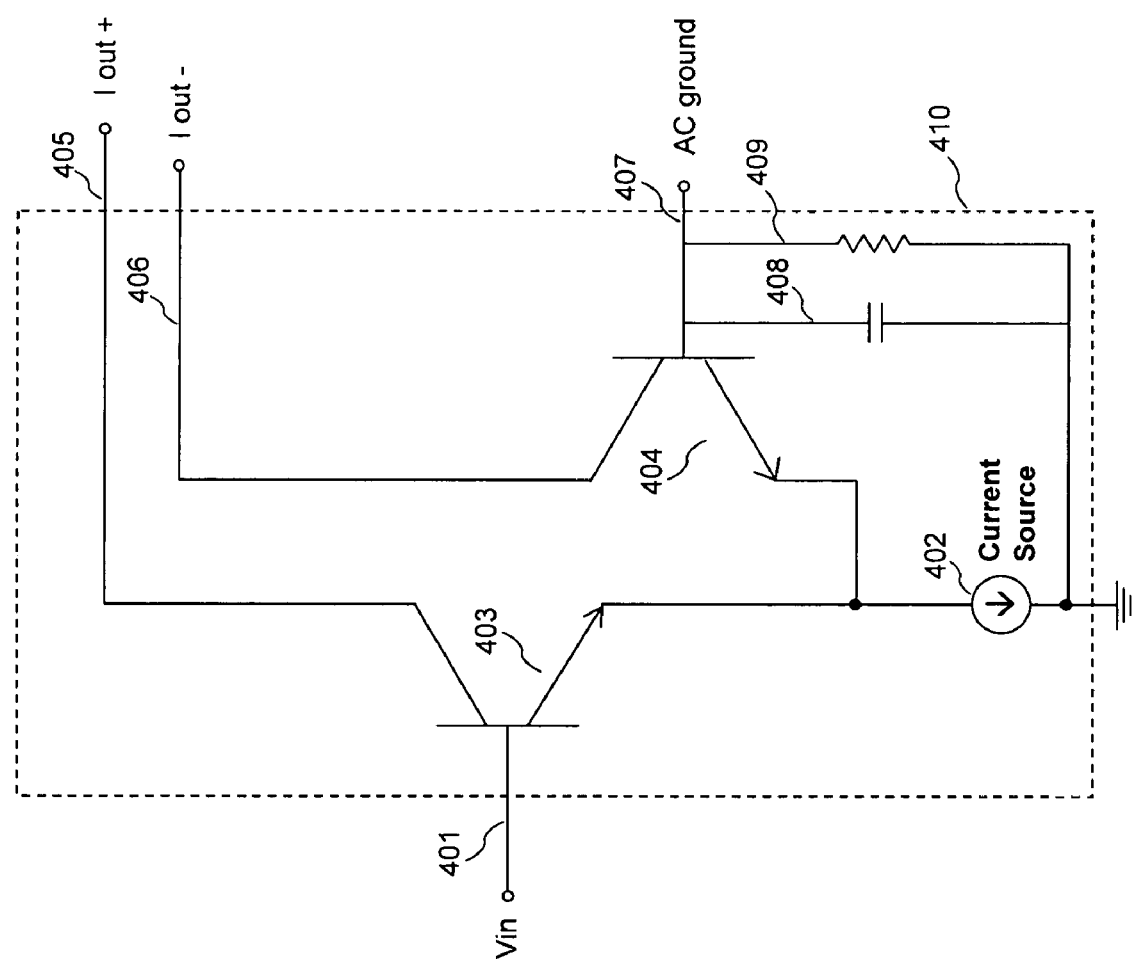
FIG. 4b depicts a different circuit using a pair of transistors to form a quasi differential pair, according to an different embodiment of the present teaching.

The present teaching describes different exemplary VGA circuits that eliminate base transistors along a signal path to improve the VGAs' performance with respect to bandwidth, input noise, etc. FIG. 4a depicts an exemplary circuit of a building block that uses a pair of transistors 403 and 404 having their emitters coupled together to form a quasi differential pair 400, according to an embodiment of the present invention. The base of transistor 403 is connected to an input voltage Vin (401) and the base of transistor 404 is AC grounded (407) and coupled to a gain control. The coupled emitters are connected to ground (402-a) via a current source (402). The collector of transistor 403 is connected to output current Iout+ (405). The collector of transistor 404 is connected to a differential output Iout− (406). FIG. 4b depicts a quasi differential pair 410 having all the same components as in the transistor pair 400 except an additional capacitor 408 and a resistor 409 to provide AC ground 407 at the base of transistor 404.

Figure 4C:
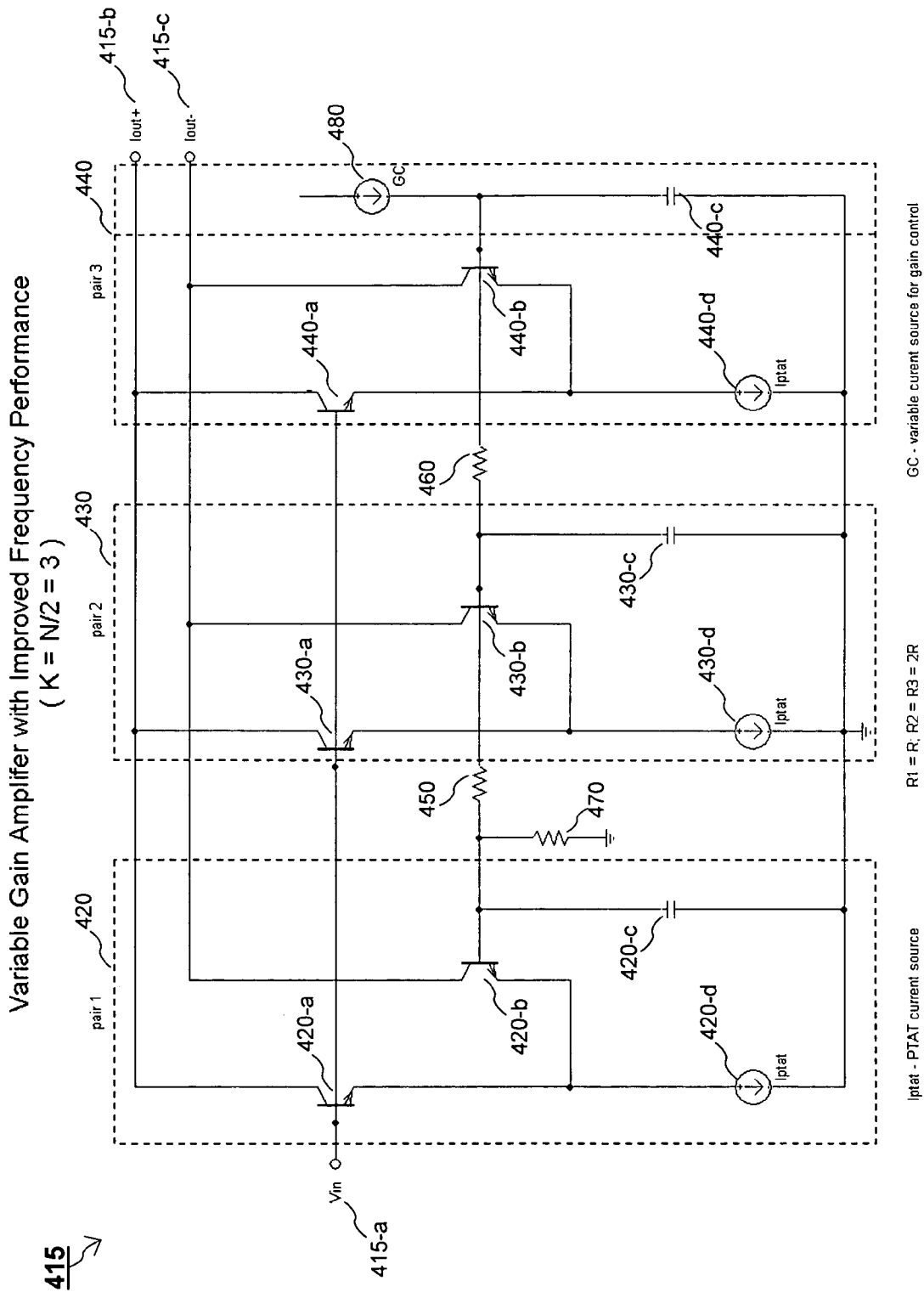
FIG. 4c depicts a multi-stage VGA according to an embodiment of the present teaching.

FIG. 4c depicts an embodiment of a multi-stage VGA 415 according to an embodiment of the present teaching. The exemplary circuit of the multi-stage VGA 415 has an input voltage Vin 415-a and provides outputs Iout+ (415-b) and Iout−(415-c). Internally, the multi-stage VGA 415 comprises 3 stages, corresponding to 420, 430, and 440. Each of the stages is implemented using a quasi differential pair as described in FIG. 4a or FIG. 4b. At the first stage (420), a quasi differential pair of transistors 420-a and 420-b having their emitters coupled together connects to a current source 420-d. The collector of transistor 420-a is connected to Iout+ (415-b) and the collector of transistor 420-b is connected to Iout− (415-c). The base of transistor 420-a is connected to the input voltage Vin (415-a). A capacitor 420-c and a base resistor 470 are coupled to the base of transistor 420-b to implement AC ground. The resistor 470 is also placed to introduce DC offset. At certain frequencies of interest, it can be assumed that the base resistor 470 is small enough or the capacitor 420-c is large enough so that they are AC grounded. The base of transistor 420-b is also connected to a gain control 480 via resistors 450 and 460 along the signal path.

At the second stage (430), a quasi differential pair of transistors 430-a and 430-b having their emitters coupled together connects to a current source 430-d. The collector of transistor 430-a is connected to Iout+ (415-b) and the collector of transistor 430-b is connected to the differential output Iout− (415-c). The base of transistor 430-a is directly connected, in series, to the base of transistor 420-a of the first pair 420 and to the input voltage 415-a. A capacitor 430-c is coupled to the base of transistor 430-b to provide AC ground. The base of transistor 430-b is also connected, in series, to the base of transistor 420-b via a resistor 450 along the signal path.

At the third stage (440), a quasi differential pair of transistors 440-a and 440-b having their emitters coupled together connects to a current source 440-d. The collector of transistor 440-a is connected to Iout+ (415-b) and the collector of transistor 440-b is connected to the differential output Iout− (415-c). The base of transistor 440-a is directly connected, in series, to the base of transistor 430-a of the second pair 430, the base of transistor 420-a of the first pair 420, and to the input 415-a. A capacitor 440-c is coupled to the base of transistor 440-b to provide AC ground. The base of transistor 440-b is also connected, in series, to the base of transistor 430-b via a resistor 460 and to the base of transistor 420-b via resistor 450. The resistors 450 and 460 introduce DC offsets and do not contribute to AC performance. In some embodiments, the resistors 456 and 460 are of equal resistance.

In FIG. 4c, since there is no base resistor in the signal path formed by transistors 420a, 430-a, and 440-a, the frequency and noise performance of VGA 415 is improved. This can be illustrated through the expression of gain with respect to control current:

$$I_{out}(V_{in}) = \alpha_F * I_{ptat} * \sum_{i=1}^{n} \tanh\frac{V_{in} - \varphi_i}{2V_T} \quad (3)$$

$$\varphi_i/(R*GC) = 1, 3, \ldots, 2k-1 \quad \text{for } i = 1, 2, \ldots, k$$

where $I_{ptat}$ is the tail current of an emitter-coupled pair (420-d, 430-d, or 440-d). The transconductance of the VGA 415 can be derived by differentiating $I_{out}$ with respect to $V_{in}$ as follows:

$$gm(V_{in}) = \frac{\alpha_F * I_{ptat}}{2V_T} * \sum_{i=1}^{k} \text{sech}^2 \frac{V_{in} - \varphi_i}{2V_T} \quad (4)$$

The AC operation of the circuit is described below. Using a single pair (e.g., first pair 420) as an example, when the current source 420-d has infinite impedance, the input voltage Vin (415-a) is divided equally across the base-emitter junctions of 420-a and 420-b. That is, in/2 is applied to the base-emitter junction of 420-a and Vin/2 is applied to the base-emitter junction of 420-b. In this case, the output currents at collectors of 420-a and 420-b are fully differential and, as a result, the even-order distortion products are cancelled out.

However, in some operating conditions, such a pair may not function as a fully differential pair. For example, at a high operating frequency, a current source may not have infinite impedance. In this case, signal may leak into the finite impedance at the coupled emitters of 420-a and 420-b. Consequently, the input voltage Vin may not be evenly divided across the base-emitter junctions of 420-a and 420-b. The base-emitter junction of 420-a receives a larger input signal than the emitter-base junction of 420-b. Under such conditions, the output collector currents of 420-a and 420-b is not fully differential and, hence, even-order distortions are only partially cancelled out. This impact at a high frequency occurs because a pair of transistors, as depicted in FIG. 4a or FIG. 4b, is constructed not as a fully differential pair and can be improved by modifying the circuit of a cell as described below.

Figure 5A:
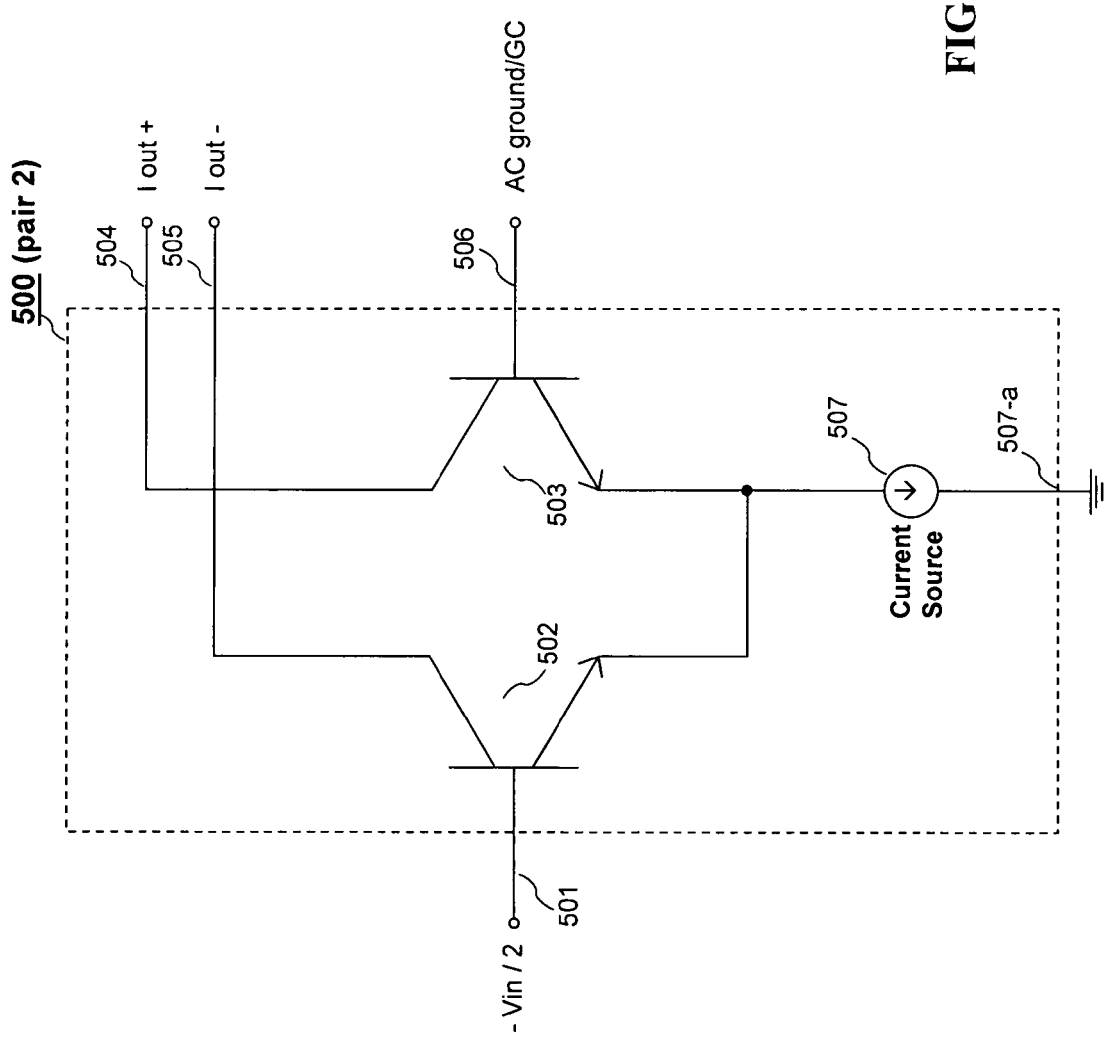
FIG. 5a depicts an exemplary circuit using a pair of transistors to form a quasi differential pair, according to an embodiment of the present teaching.

FIG. 5a depicts a different exemplary pair 500 of emitter-coupled transistors, according to an embodiment of the present teaching. The pair 500 comprises a first transistor 502, a second transistor 503, and a current source 507. The emitters of both transistors are coupled together to connect to ground via the current source 507. The base of transistor 502 is connected to an input voltage −Vin/2 (501) and the base of transistor 503 is connected to AC ground and a gain control (506). The collector of transistor 503 is connected to Iout+ (504) and the collector of transistor 502 is connected to a differential output Iout− (505).

Figure 5B:
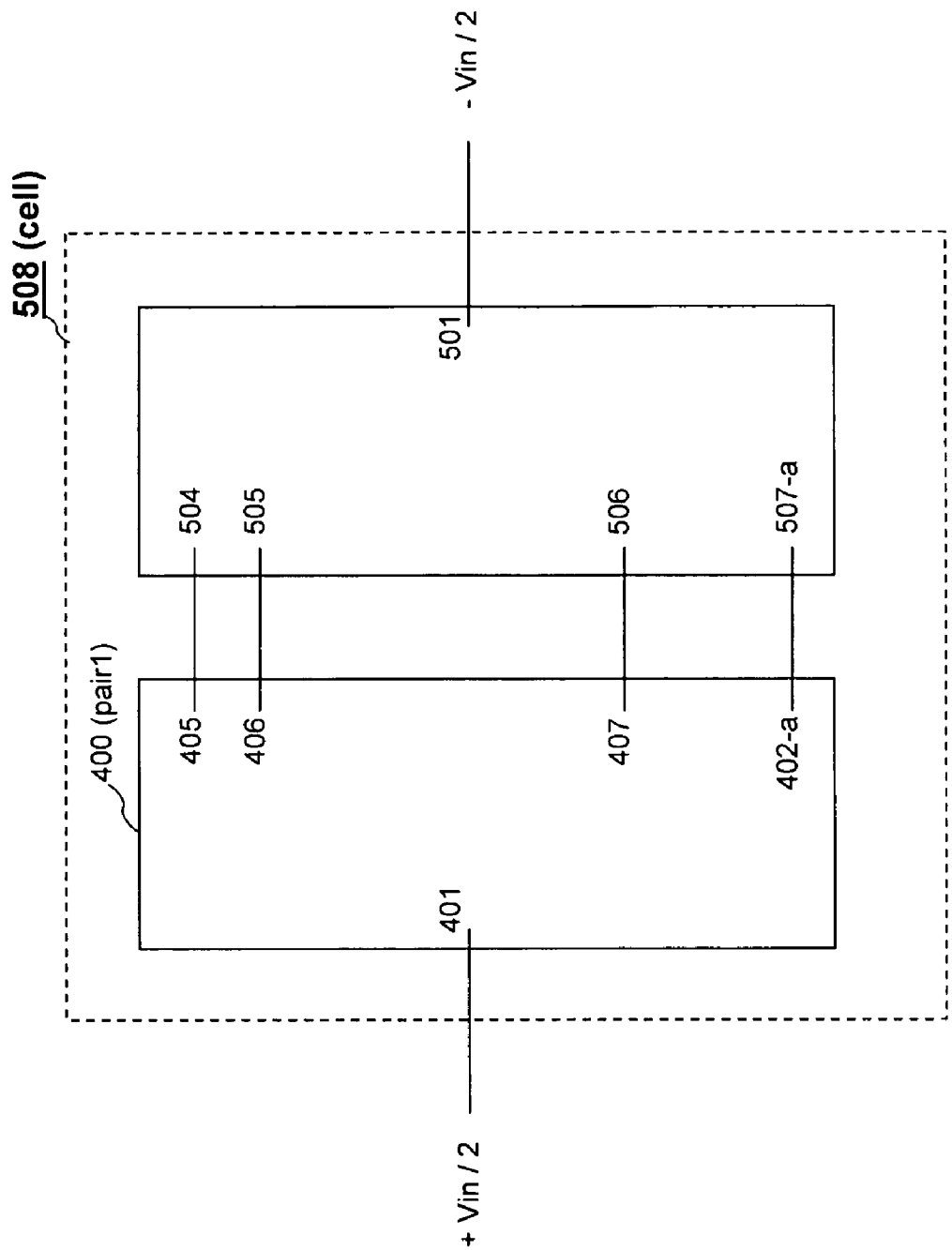
FIG. 5b depicts an exemplary connection made between two quasi differential pairs of transistors to form a VGA cell, according to an embodiment of the present teaching.
Figure 5C:
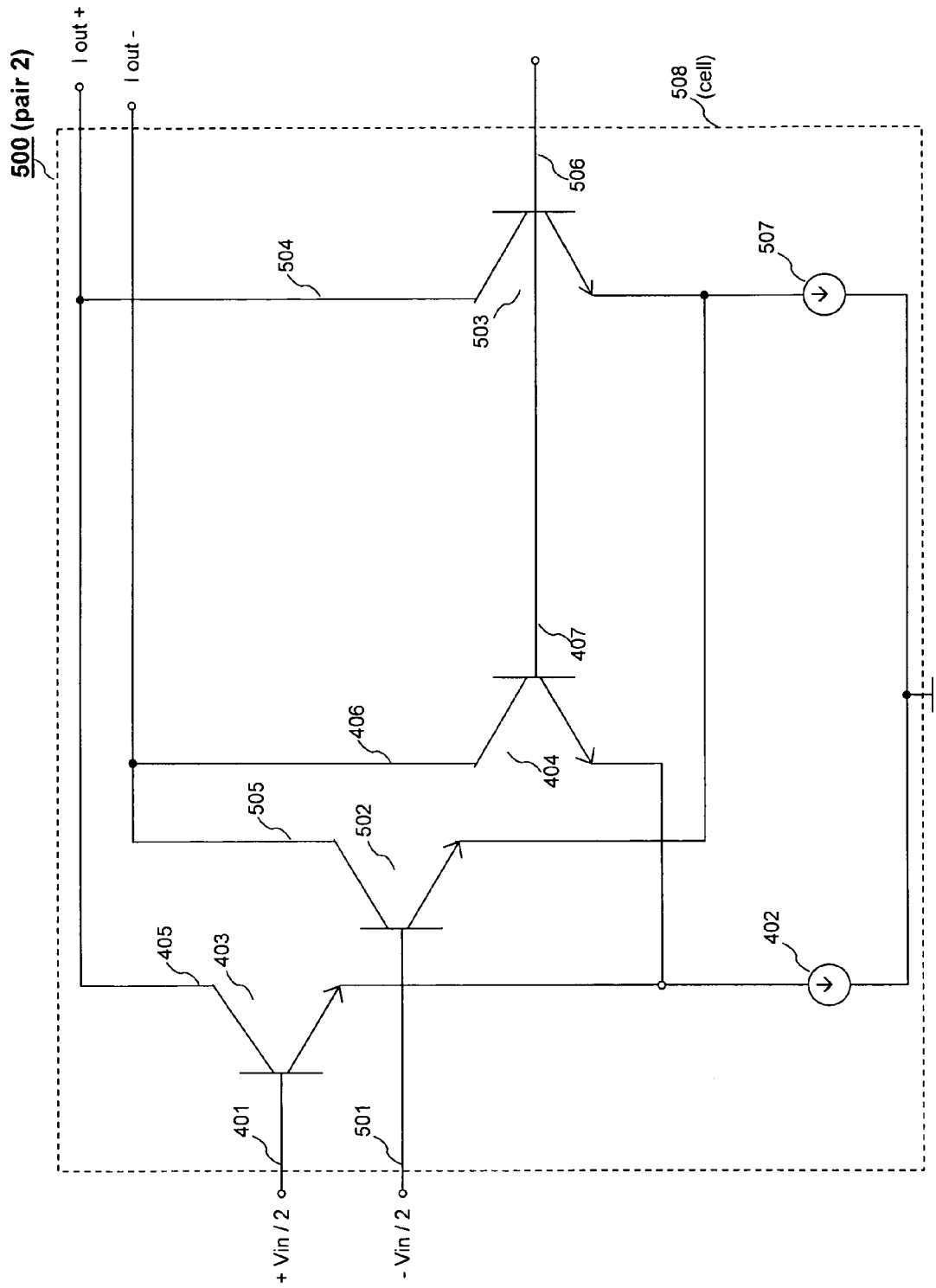
FIG. 5c depicts an exemplary circuit using two quasi differential pairs of transistors to form a VGA cell, according to an embodiment of the present teaching.

FIG. 5b illustrates an exemplary stage 508 of a VGA, constructed by coupling a first transistor pair 400 and a second transistor pair 500, according to an embodiment of the present teaching. In this illustrated embodiment, the transistor pair 400 is constructed according to FIG. 4a or FIG. 4b and the transistor pair 500 is constructed according to FIG. 5a. The ground terminal 402-a in FIG. 4a and the ground terminal 507-a in FIG. 5a are coupled together to connect to the ground. The input terminal 401 of pair 400, or the base of transistor 403, is connected to an input voltage +Vin/2. The input terminal 501 of pair 500, or the base of transistor 502, is connected to an input voltage −Vin/2. The Iout+ terminal (405) of pair 400 is coupled with the Iout+ terminal (504) of pair 500 and the Iout− terminal (406) of pair 400 is coupled with the Iout− terminal (505) of pair 500. The base of transistor 404 (406) of pair 400 is serially connected to base of transistor 503 of pair 500. FIG. 5c shows the detailed circuit of VGA 508, according to an embodiment of the present teaching. Each of the pairs has its own current source (402 and 507).

Figure 5D:
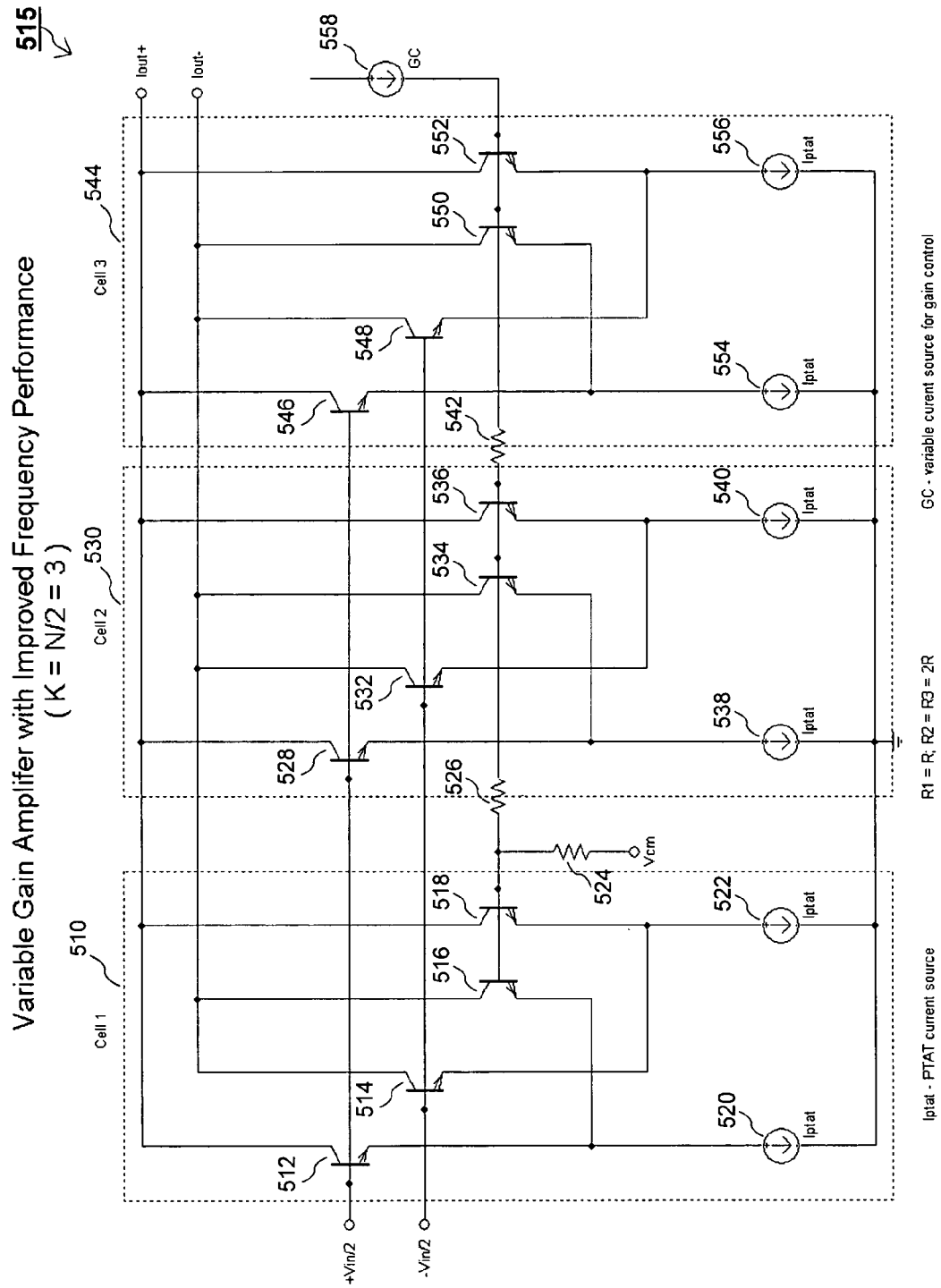
FIG. 5d depicts a multi-stage VGA constructed according to an embodiment of the present teaching.

FIG. 5d depicts an exemplary 3-stage VGA 515 with each stage being constructed using the VGA cell 508 as described in FIG. 5c, according to an embodiment of the present teaching. There are three stages of VGA cells, 510, 530, and 544, that are connected in series with a resistor 526 between 510 and 530 and a resistor 542 between 530 and 544. In this exemplary circuit, the base terminal of transistor (512) in cell 510 connecting to a positive input voltage +Vin/2 is coupled directly, in series, to the base terminal of transistor 528 in cell 530 and the base terminal of transistor 546 in cell 544. The base terminal of transistor 514 in cell 510 connecting to a negative input voltage −Vin/2 is directly coupled, in series, to the base terminal of transistor 532 in cell 530 and the base terminal of transistor 548 of cell 544. In each cell, there are two base-coupled transistors, i.e., transistors 516 and 518 in cell 510, transistors 534 and 536 in cell 530, and transistors 550 and 552 in cell 544. These base-coupled transistors are also connected in series to a gain control 558 via resistors 524, 526 and 542, which introduce DC offsets between the bases of connected cells.

Internally, each cell of VGA 515 comprises two pairs of transistors and two current sources connected to the coupled emitters of the transistors. For example, cell 510 includes a first pair of transistors 512 and 516, a second pair of transistors 514 and 518, and two separate current sources 520 and 522. Each pair of transistors is am emitter-coupled pair with the coupled emitters connecting to a corresponding current source. The coupled emitters of 512 and 516 are connected to ground via current source 520 and the coupled emitters of 514 and 518 are connected to ground via current source 522. In a preferred embodiment, both current sources have the same tail currents.

Cells 530 and 544 are similarly constructed. Cells 530 comprises two emitter-coupled transistor pairs, 528-534 and 532-536, and separate current sources 538 and 540, connecting to the two pairs, respectively. Cells 544 comprises two emitter-coupled transistor pairs, 546-550 and 548-552, and separate current sources 554 and 556, connecting to the corresponding transistor pairs. The common base of transistors 516 and 518 are also connecting to resistor 524 for providing AC ground. In some embodiments, when the resistance of resistor 524 is R, the resistance of both resistors 526 and 542 are 2*R.

In operation, each stage of VGA 515 functions as a fully differential pair. This can be seen as follows. The output transfer function can be written with respect to an input voltage as follows:

$$Iout(Vin) = a_1 * V_{in} + a_2 * V_{in}^2 + a_3 * V_{in}^3 + a_4 * V_{in}^4 + \text{higher order terms} \quad (5)$$

Based on the differential topology as depicted in FIG. 5d, the output currents, Iout+ and Iout−, associated with the positive input +Vin/2 and the negative input −Vin/2, can be respectively written as follows:

$$Iout(+V_{in}/2) = a_1 * V_{in}/2 + a_2 * (V_{in}/2)^2 + a_3 * (V_{in}/2)^3 + a_4 * (V_{in}/2)^4 + \text{higher order} \quad (6)$$

$$Iout(-V_{in}/2) = -a_1 * V_{in}/2 + a_2 * (-V_{in}/2)^2 - a_3 * (V_{in}/2)^3 + a_4 * (-V_{in}/2)^4 + \text{higher order} \quad (7)$$

Combining (6) and (7), the total output current is expressed as:

$$Iout(V_{in}) = Iout(+V_{in}/2) - Iout(-V_{in}/2) = 2 * a_1 * V_{in}/2 + 2 * a_3 * (V_{in}/2)^3 + \text{higher odd order} \quad (9)$$

As can be seen, the even order distortions are effectively eliminated. The output current with respect to a control current can be written as follows:

$$I_{out}(V_{in}) = 2 * \alpha_F * I_{ptat} * \sum_{i=1}^{k} \tanh \frac{V_{in} - \varphi_i}{4V_T} \quad (10)$$

$$\varphi_i / (R * GC) = 1, 3, \ldots, 2k-1 \quad \text{for } i = 1, 2, \ldots, k$$

where $I_{ptat}$ is the tail current of an emitter-coupled pair. The transconductance of VGA 515 can be derived by differentiating $I_{out}$ with respect to $V_{in}$. That is, $$gm(V_{in}) = \frac{\alpha_F * I_{ptat}}{2V_T} * \sum_{i=1}^{k} \text{sech}^2 \frac{V_{in} - \varphi_i}{4V_T} \quad (11)$$

Figure 6:
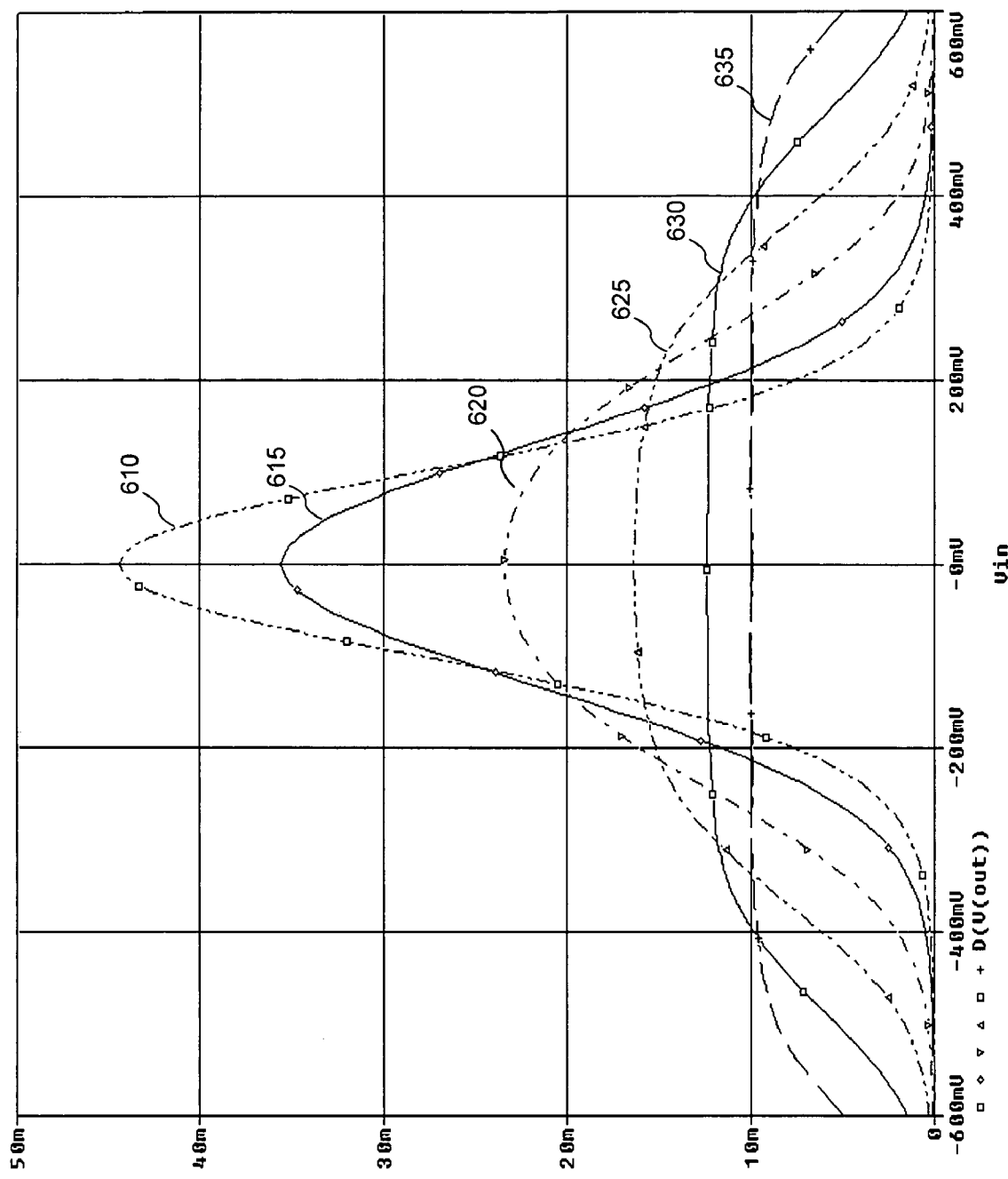
FIG. 6 illustrates improvement of transconductance of a multi-stage VGA, constructed according to an embodiment of the present teaching, with respect to an input voltage under different gain control currents.

FIG. 6 shows simulation results on transconductance of the multi-stage VGA 515. The plots represent transconductance of VGA 515 with respect to input voltage under different gain control currents. The X axis represents the input voltage and the Y axis represents the transconductance. The most sharp curve corresponds GC=0. The curve marked with a diamond symbol corresponds to GC=120. The curve marked with a downward triangle symbol corresponds to GC=240. The curve marked with a upward triangle symbol corresponds to GC=360. The curve marked with a square symbol corresponds to GC=480. The curve marked with a "+" symbol corresponds to GC=600.

Figure 1:
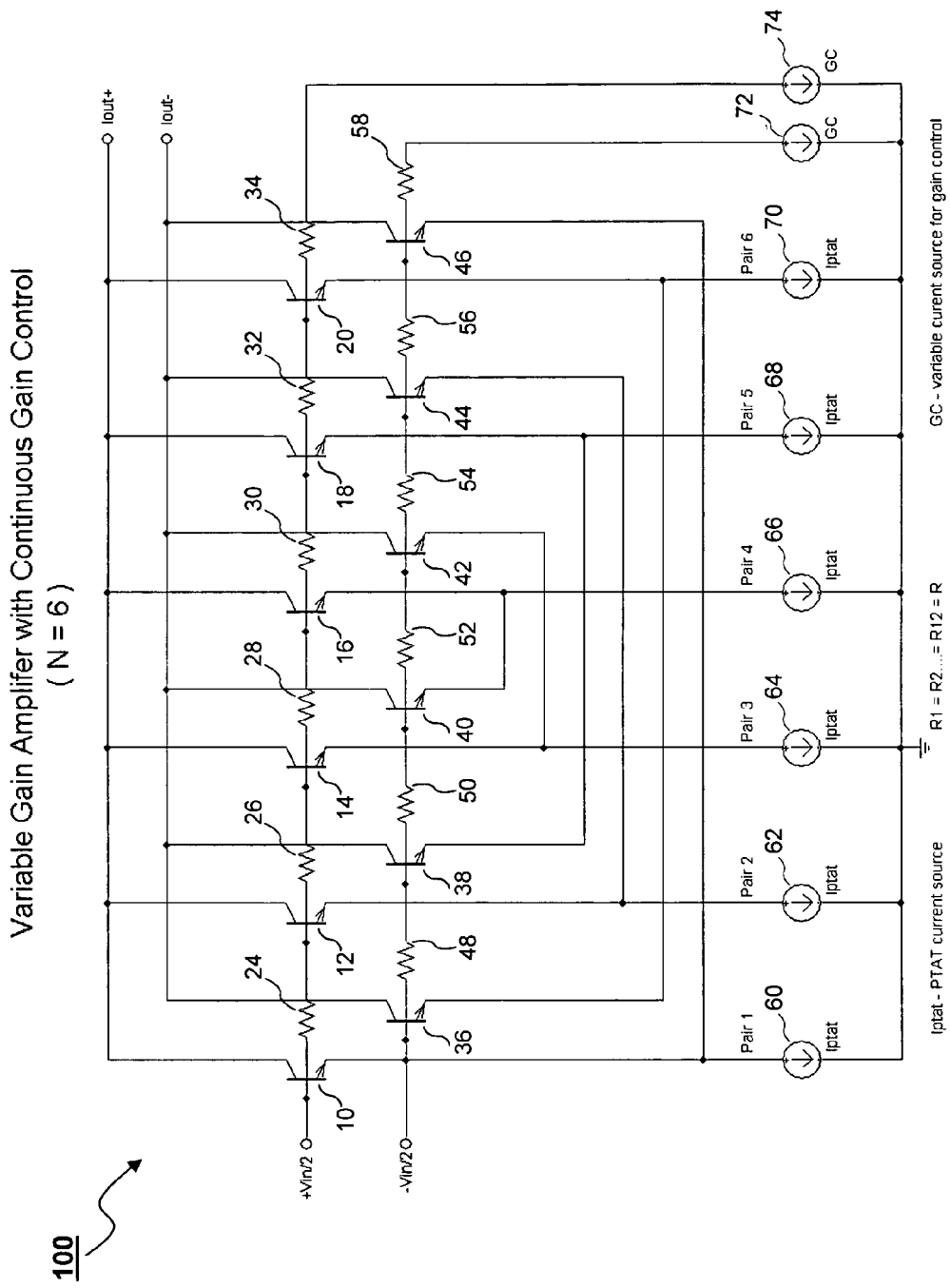
FIG. 1 (Prior Art) depicts a circuit for a variable gain amplifier.
Figure 2:
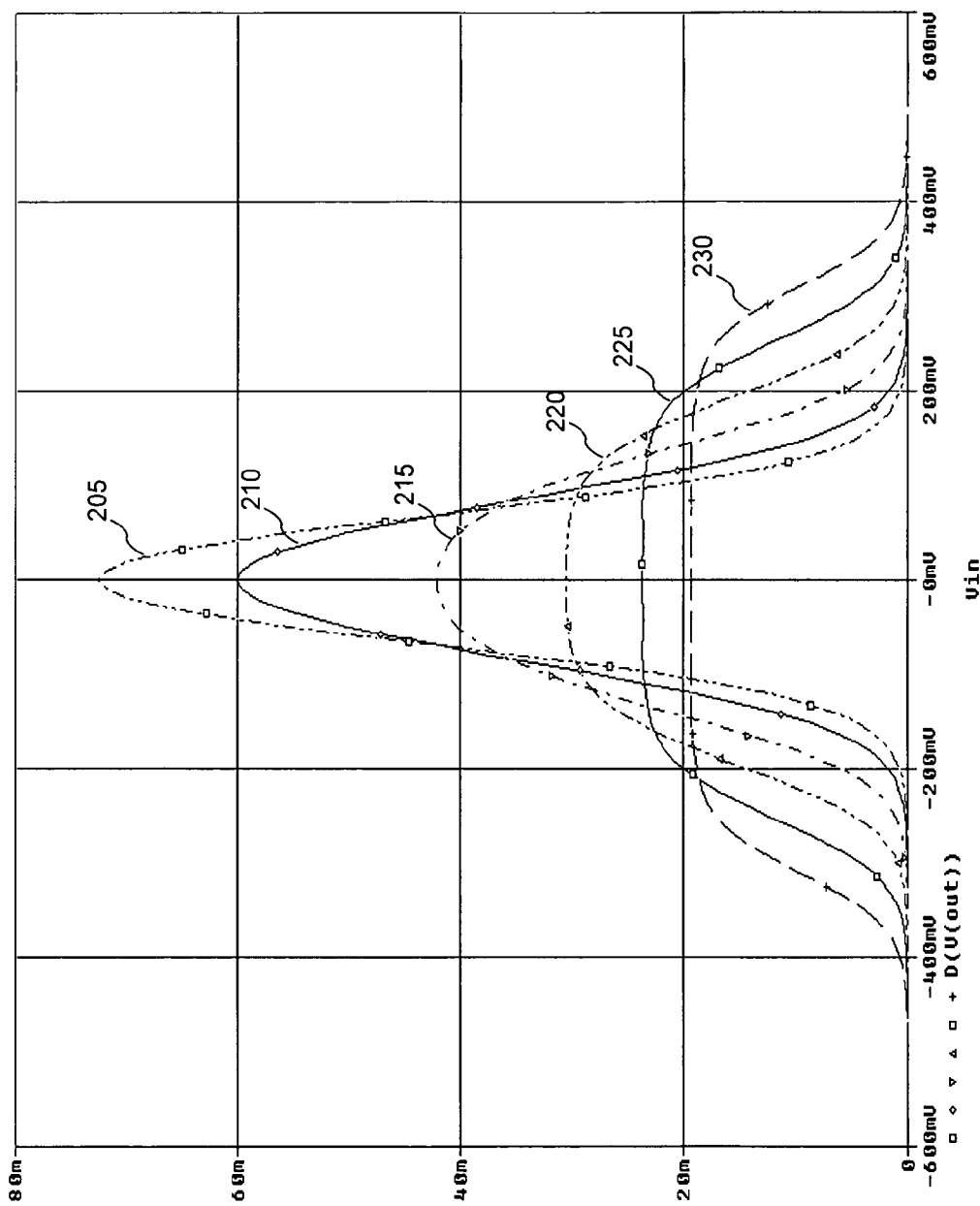
FIG. 2 (Prior Art) shows plots of transconductance of a VGA with respect to an input voltage under different gain control current.

Each plot corresponds to a different gain control setting. Compared with the plots in FIG. 2, which shows the frequency response and noise performance of a conventional VGA with respect to the same operational parameters (e.g., gain control range, input voltage range, etc.), the VGA 515 maintains a linear performance over a wider range of input voltage across all gain control settings. Since the bases of the common base transistors in VGA 515, i.e., transistors 516 and 518 in cell 510, transistors 534 and 536 in cell 530, and transistors 550 and 552 in cell 544, are AC grounded, resistors 524, 526, and 542 do not contribute to noise. Those resistors are not in the signal path so that the frequency response is improved. The gain control current GC does not contribute to noise either.

Figure 3A:
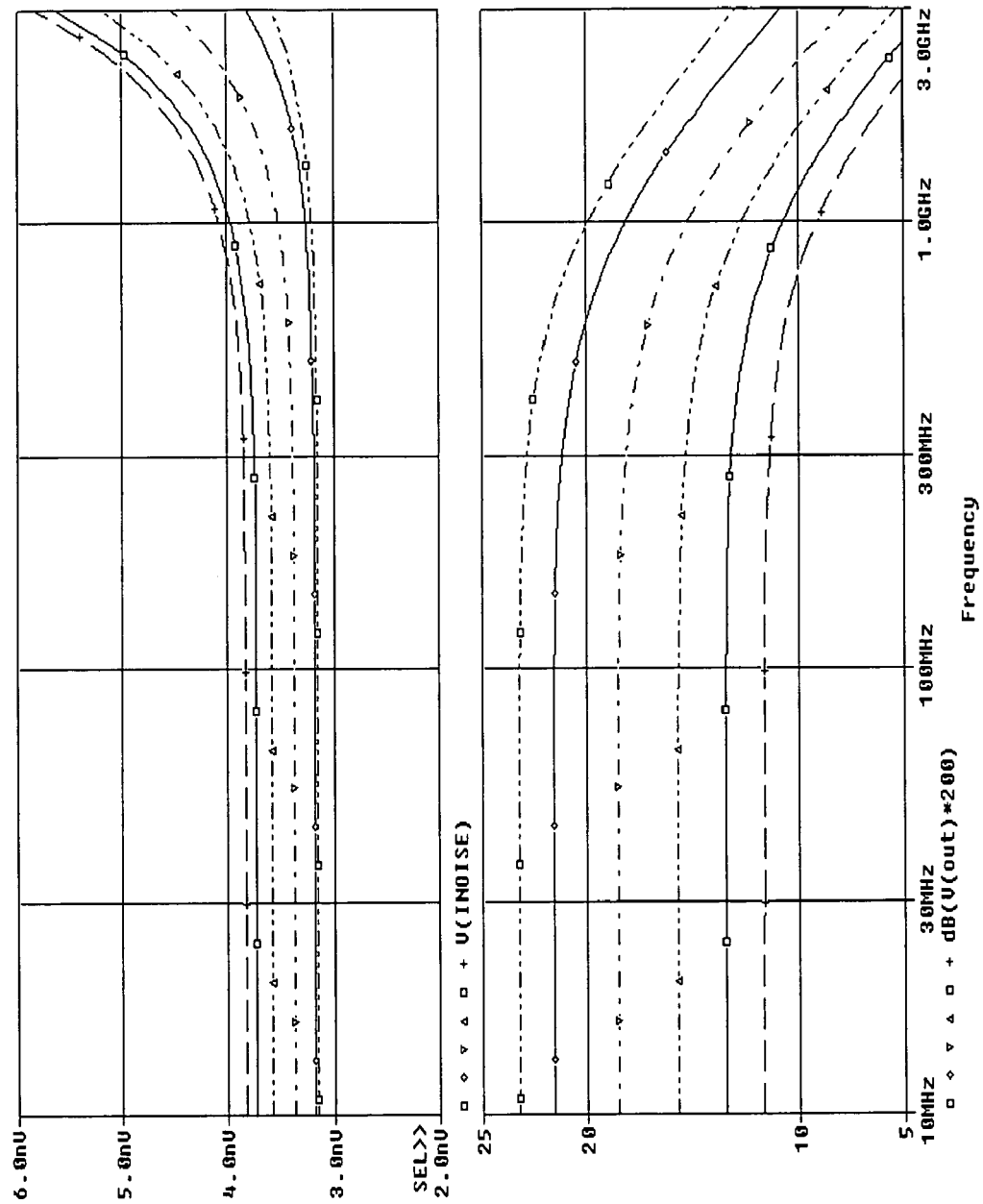
FIG. 3a (Prior Art) shows plots of a VGA's gain with respect to frequency under different noise conditions.
Figure 7:
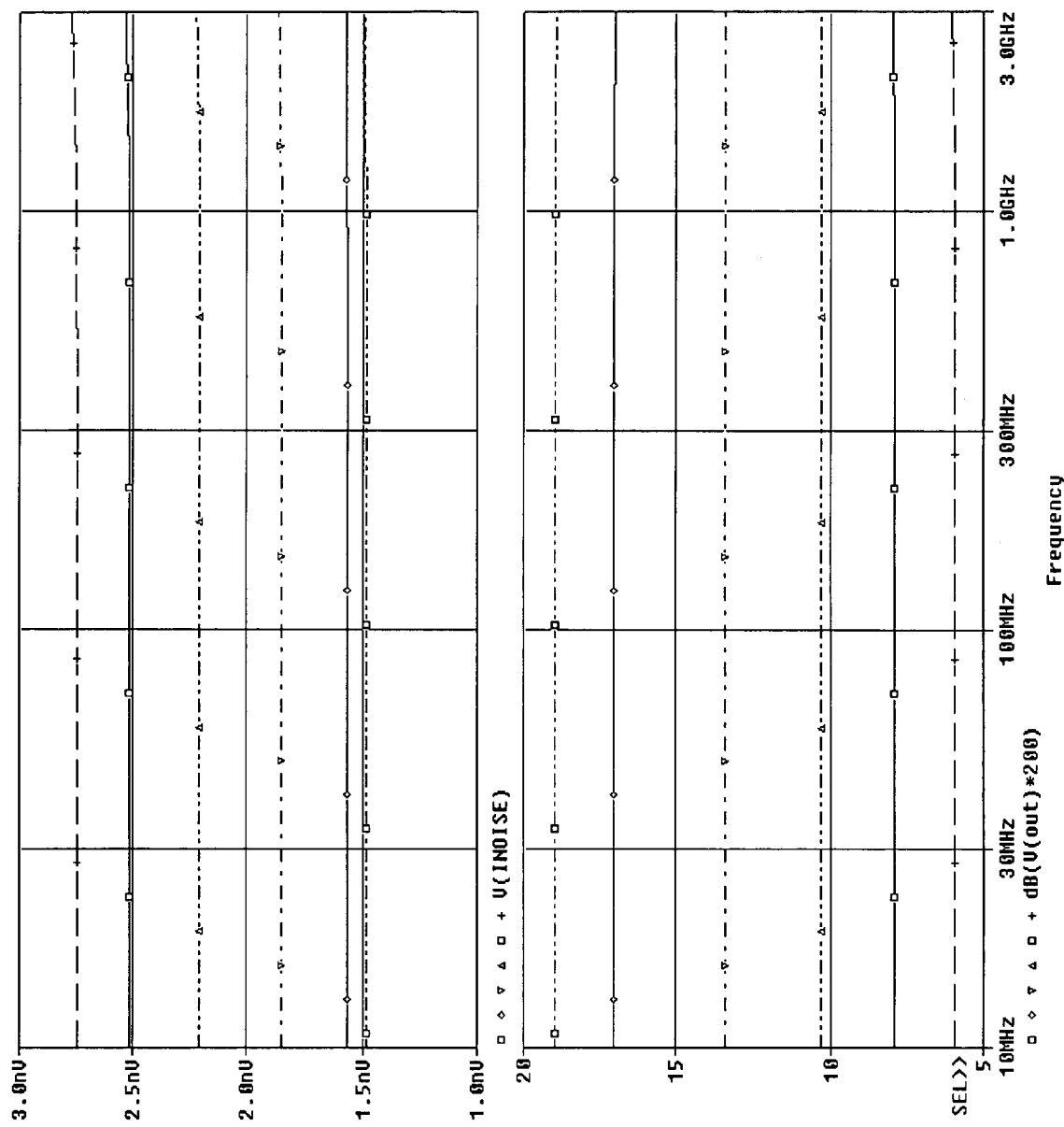
FIG. 7 illustrates improvement of gain of a multi-stage VGA, constructed according to an embodiment of the present teaching, with respect to frequency under different noise conditions.

FIG. 7 shows plots of the gain of the VGA 515 with respect to frequency under different noise conditions. The X axis and the Y axis in FIG. 7 represent the same measures as in FIG. 3a. Different curves in both plots also correspond to the same GC settings as in FIG. 3a. Compared with the plots shown in FIG. 3a, both the VGA's (515) frequency response and performance under noise condition are improved.

Figure 8:
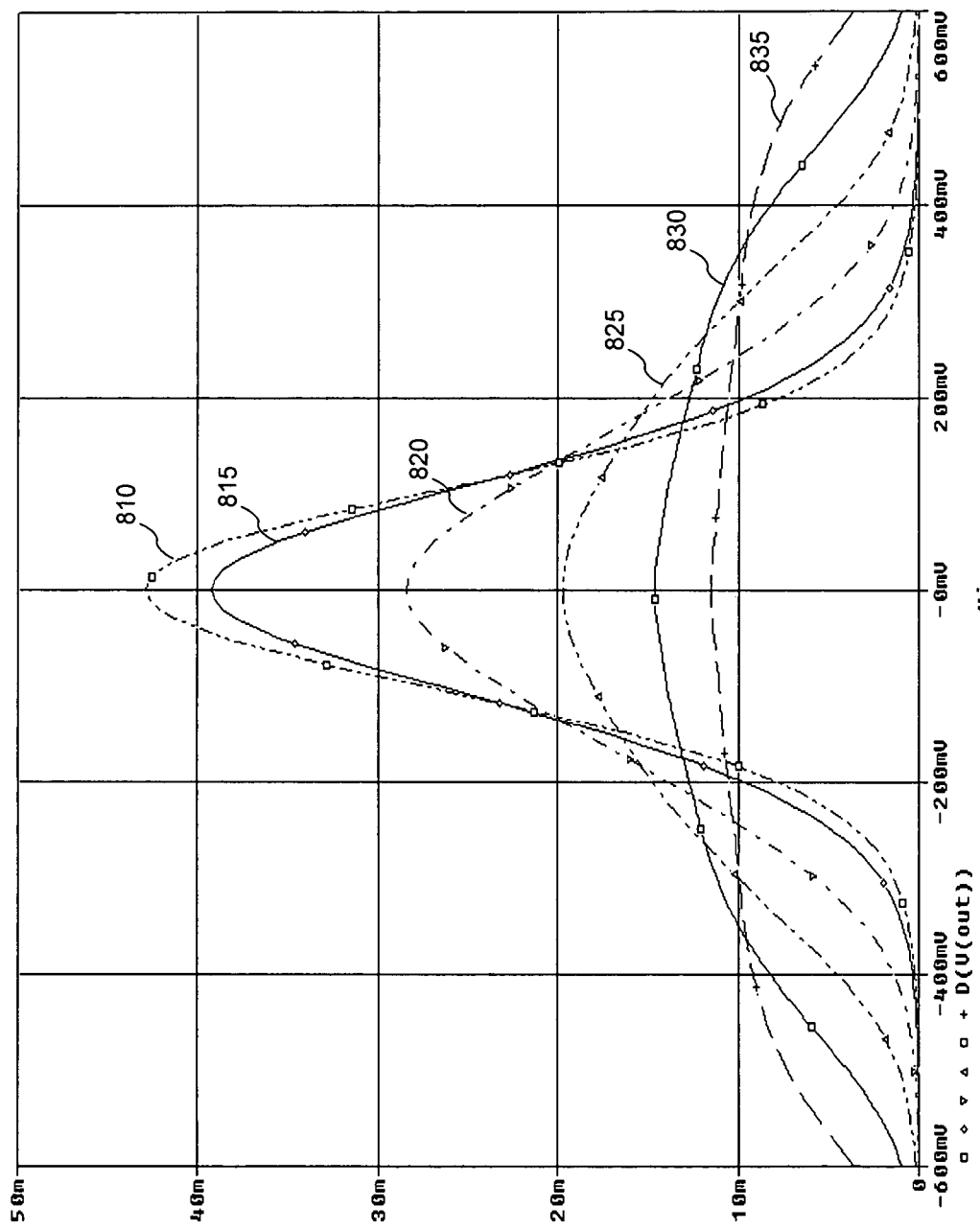
FIG. 8 illustrates the impact of finite beta on transconductance of a multi-stage VGA, constructed according to an embodiment of the present teaching.

In situations where the GC current 558 is reduced for low power consumption, to maintain the same level of DC offsets, the resistances of resistors 524, 526, and 542 may can be adjusted proportionally. In addition, a change in base currents of the common base transistors (e.g., 516 and 518 in cell 510, 534 and 536 in cell 530, and 550 and 552 in cell 544) due to finite beta of the transistors may also cause additional undesirable impact on DC offsets. An increased DC offset may reduce the contribution to the VGA's transconductance (i.e., gm) from the corresponding cell. A decrease in DC offset may increase the contribution of the corresponding cell to the VGA's transconductance. FIG. 8 visualizes the impact of finite beta on the transconductance of VGA 515. The X axis and the Y axis in FIG. 8 represent the same measures as in FIG. 6. Different plots in FIG. 8 correspond to different gain control currents, each with the same gain control settings as the corresponding curve shown in FIG. 6. As seen in FIG. 8, the linearity of the transconductance of VGA 515 degrades when DC offsets can not be maintained at the same level.

Figure 9:
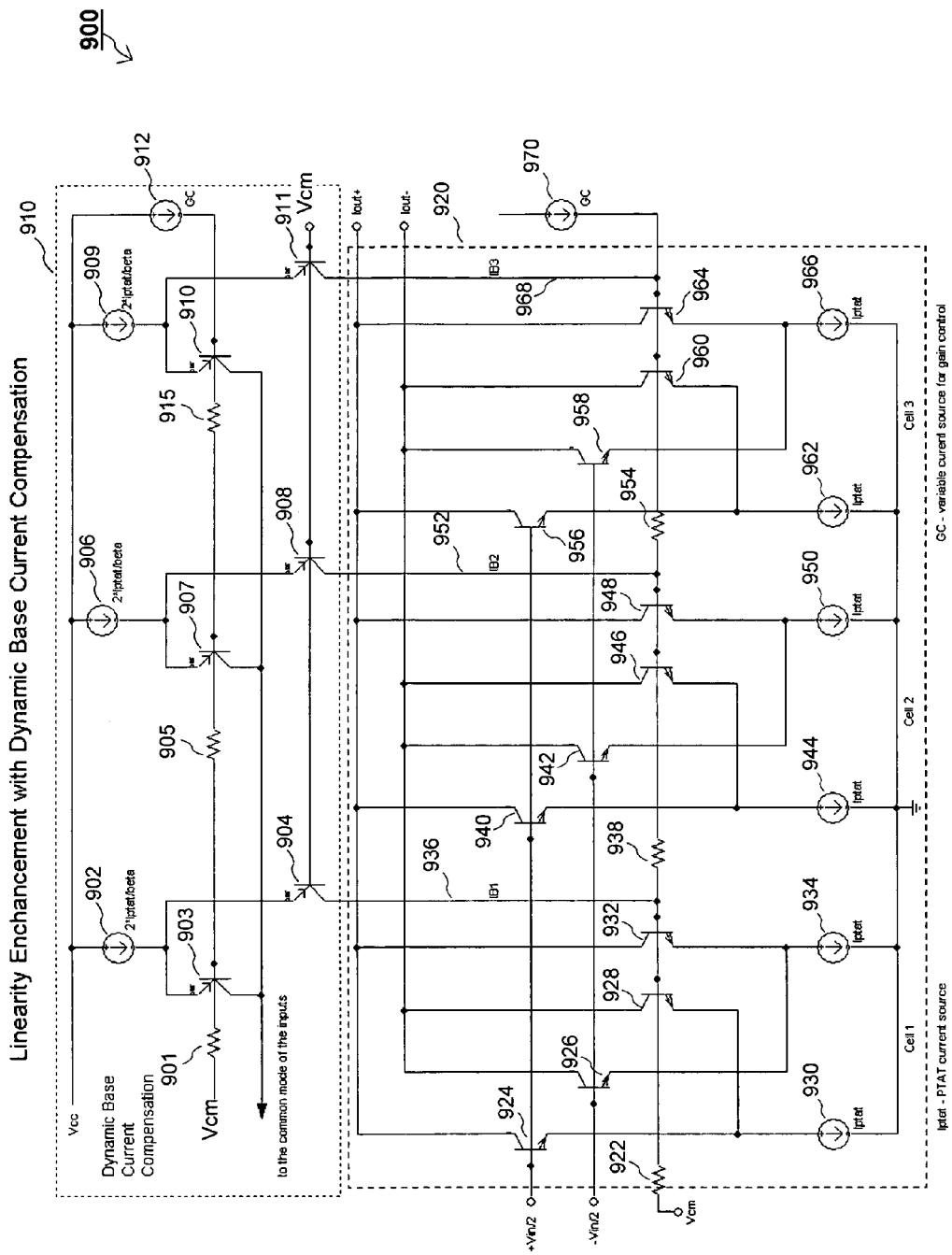
FIG. 9 depicts an exemplary circuit implementation of a multi-stage VGA with dynamic base current compensation, according to an embodiment of the present teaching.

The negative impact of a finite beta can be compensated to enhance the linearity of VGA 515. FIG. 9 depicts an exemplary circuit of an improved multi-stage VGA 900 with dynamic base current compensation, according to an embodiment of the present teaching. The improved VGA 900 comprises a multi-stage VGA 920 and a dynamic base current compensation unit 910. The multi-stage VGA 920 is shown as an exemplary three-stage VGA, e.g., constructed, e.g., according to the present teaching as described in FIG. 5d. Transistors 924, 926, 928 and 932 form a first cell at the first stage, transistors 940, 942, 946, and 948 form a second cell at the second stage, and transistors 956, 958, 960, and 964 form a third cell at the third stage. Each of the three cells has a base current flowing into two base coupled transistors from two different sources. One source originates from a gain control (GC)970 and the other originates from the dynamic base current compensation unit 910. For example, the base current flowing into the two base-coupled transistors 928 and 932 of the first cell comprises a current originating from GC 970 and a dynamically compensated base current 936. The base current flowing into the two base-coupled transistors 946 and 948 of the second cell comprises a current originating from GC 970 and a dynamically compensated base current 952. The base current flowing into the two base-coupled transistors 960 and 964 of the third cell comprises a current originating from GC 970 and a dynamically compensated base current 968.

The dynamic base current compensation unit 910 comprises two sub-units. The first sub-unit comprises resistors 915, 905, and 901, transistors 903, 907, and 910, GC 912, and current sources 902, 906, and 909. The GC 912 operates at the same setting as GC 970 and the resistors 901, 905, and 915 have the same resistance as that of resistors 922, 938, and 954 so that the base voltages at the bases of transistors 910, 907, and 903 replicate the base voltages at the bases of transistors 964, 948, and 932. The second sub-unit of 910 comprises transistors 904, 908, and 911, each of which is responsible for generating a dynamical base current flowing into the base terminal of two base-coupled transistors in a corresponding cell of VGA 920. For example, the dynamically controlled current 936 flows from the collector of transistor 904 to the common base of transistors 932 and 928. The dynamically controlled current 952 flows from the collector of 908 into the common base of transistors 948 and 946. The dynamically controlled current 968 flows from the collector of 911 into the common base of transistors 964 and 960.

In operation, the base currents of base-coupled transistors may vary depending upon the gain control setting. To produce a desirable DC offset (as described in Equation 10) for all gain control settings, it is preferred to ensure that the same amount of gain control current flowing through resistors 922, 938, and 954. For example, the base current to the first cell comprising transistors 924-932 is 2*Iptat/beta, where beta is the current gain of the transistors 924-932 and Iptat is the current of each of the current sources 930 and 934. Similarly, the total base current to each of the second cell and the third cell, respectively, is also 2*Iptat/beta (assuming that all transistors have the same beta value). Base current may vary with the gain control setting. When this occurs, the actual control current flowing through resistor 922 is gain control minus base currents of 964, 960, 948, 946, 932, and 928. The actual control current flowing through resistor 938 is gain control minus base currents of 964, 960, 948, and 946. The actual control current flowing into resistor 954 is the amount of gain control minus the base currents of 960 and 964. In this situation, the linearity of transconductance cannot be maintained (as shown in FIG. 8) without base current compensation.

With the dynamic base current compensation unit 910, the subtracted base current in each cell can be adaptively compensated to ensure that the amount of current flowing through the transistors 922, 938, and 954 remain the same, yielding the same level of DC offset. In operation, the differential pair 903 and 904 is used to produce a compensation current 936 in exactly the same amount as the total base currents of transistors 928 and 932. This can be achieved by the shown circuit because the first sub-unit of 901, as described above, replicates the common base voltage of transistors 928 and 932. That is, the base voltage of 903 equals the base voltage of 928 and 932 and the base voltage of 907 equals that of 946 and 948. In addition, the current source 902 is designed to have a tail current (2*Iptat/beta) that enables 910 to keep track of beta and Iptat parameters of VGA 920. When GC increases (i.e., both 970 and 912 increase the same way), the base voltage at the base of transistor 932 (and 928) increases to Vcm+GC*R, where R is the resistance of resistor 922. So is the base voltage of 903. Due to the increase in the input voltage at the base of transistor 932, the base current of 932 increases, which causes a decrease in the amount of current flowing through resistor 922 along the signal path.

To maintain an equal DC offset, the dynamically compensated current, e.g., 936, preferably equals the increase in the base currents of 932 and 928. Since the sub-unit of 910 replicates the signal path in VGA 920, the input voltage at the base of transistor 903 also increases to Vcm+GC*R, which causes a decrease in the base current of transistor 903 for the same amount (assuming all transistors have the same beta value) and an increase in current 936 for the same amount. The base currents of the other two exemplary cells can be similarly compensated. With this dynamic base current compensation, the control currents flowing into resistors 922, 938, and 954 remain the same for all gain settings (as if without subtracting the base currents of 928-932 pair, the 946-948 pair, or the 960-964 pair). By maintaining a desired amount of current flowing through the signal path, a desired DC offset can be maintained for all gain settings as well so that a linear transconductance can be accordingly achieved.

Figure 10:
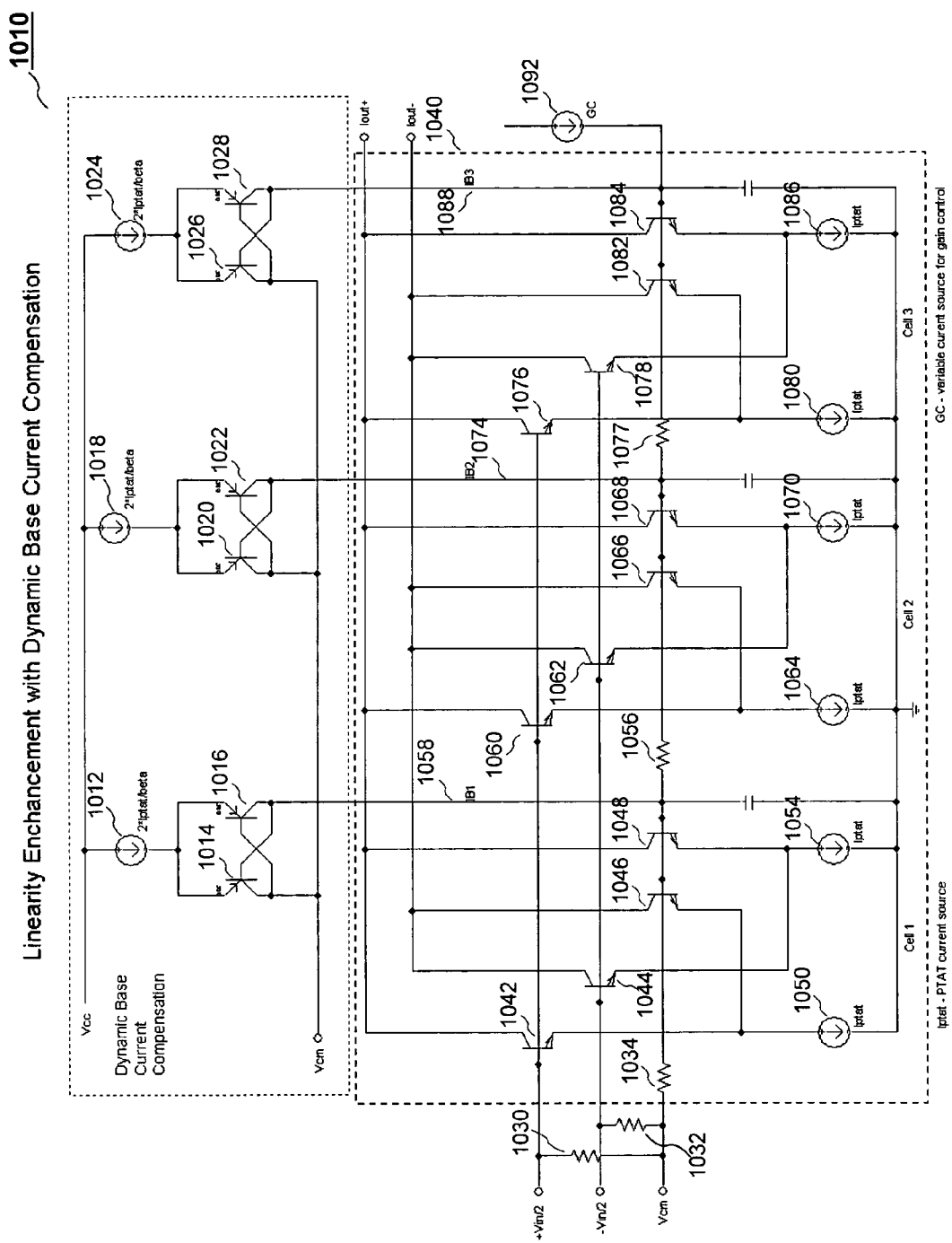
FIG. 10 depicts an exemplary circuit implementation of a multi-stage VGA with dynamic base current compensation, according to a different embodiment of the present teaching.

FIG. 10 depicts a different exemplary circuit implementation of an improved multi-stage VGA 1000 with dynamic base current compensation, according to another embodiment of the present teaching. The improved VGA 1000 similarly comprises a VGA 1040 and a dynamic base current compensation unit 1010. In this exemplary VGA 1040, there are three cells (1042-1054, 1060-1072, and 1076-1090), constructed slightly differently from what is illustrated in 920. Each cell in 1040 has a capacitor connected to the base of the two base-coupled transistors to provide AC ground. Capacitor 1052 is coupled with the common base of transistors 1046 and 1048. Capacitor 1072 is coupled with the common base of transistors 1066 and 1068. Capacitor 1090 is coupled with the common base of transistors 1082 and 1084. In addition, resistor 1030 is connected between a positive input voltage +Vin/2 at the base of transistor 1042 and a voltage reference Vcm and resistor 1032 is connected between a negative input voltage −Vin/2 and Vcm. In a preferred embodiment, the resistances of these two resistors are at the same level of resistance and are adequately small so that there is no DC offset. Resistor 1034 has resistance of R. Resistors 1056 and 1078 have the same level of resistance of 2*R.

The dynamic base current compensation unit 1010 comprises three sub-units, i.e., 1012-1016, 1018-1022, and 1024-1028, each of which corresponds to a VGA cell and is responsible for generating a dynamically controlled current for compensating the base current of the corresponding cell. The first sub-unit of 1012-1016 provides a compensation current 1058 to the common base of the first cell 1042-1054. The second sub-unit of 1018-1022 provides a compensation current 1074 to the common base of the second cell 1060-1072. The third sub-unit of 1024-1028 provides a compensation current 1088 to the common base of the third cell 1076-1090. Each sub-unit includes two transistors that are cross-connected. For example, the base of transistor 1014 in the first sub-unit 1012-1016 is coupled to the collector of transistor 1016 and vice versa. In this pair of transistors, the collector of one transistor, e.g., 1014 has its collector connected to Vcm and the other transistor, e.g., 1016 has its collector connected to the common base of two base-coupled transistors of the corresponding VGA cell, e.g., transistors 1046 and 1048. The transistors 1014-1016 in the sub-unit are also emitter-coupled, together connecting to a current source 1012 with a tail current (2*Iptat/beta).

In operation, when gain control 1092 in VGA 1040 changes, the base input voltage at the base-coupled transistors in each cell also changes. For example, when GC 1092 increases, the input voltage of transistors 1046 and 1048 is Vcm+GC'*R, where R is the resistance of resistor 1034. This higher voltage at the base of 1046 and 1048 results in a higher base currents in transistors 1046 and 1048 so that the control current flowing into resistor 1034 is GC' subtracting the base currents of 1046 and 1048. GC' equals to GC minus base currents of 1084, 1082, 1068, 1066, 1046, and 1048. To maintain a constant DC offset along the signal path, it is desirable to compensate this base current change.

As can be seen in FIG. 10, the base voltage of transistor 1014 equals the base input voltage of the base-coupled transistors 1046 and 1048. When there is an increase in the base voltage of 1046 and 1048, the collector current of 1014 decreases in the amount of the base current changes with respect to 1046 and 1048. The collector current of 1016 increases by the same amount due to the constant current source 1012, i.e., the amount of total base current changes in 1046 and 1048. Such dynamically generated compensation current is provided as the compensation current 1058 to the common base of 1046 and 1048 to increase the current flowing into resistor 1034 to compensate the subtracted amount. In this way, the DC offsets along the signal path remains constant even when the gain control 1092 changes. Other sub-units of the base current compensation unit 1010 operate in the same way.

Figure 11:
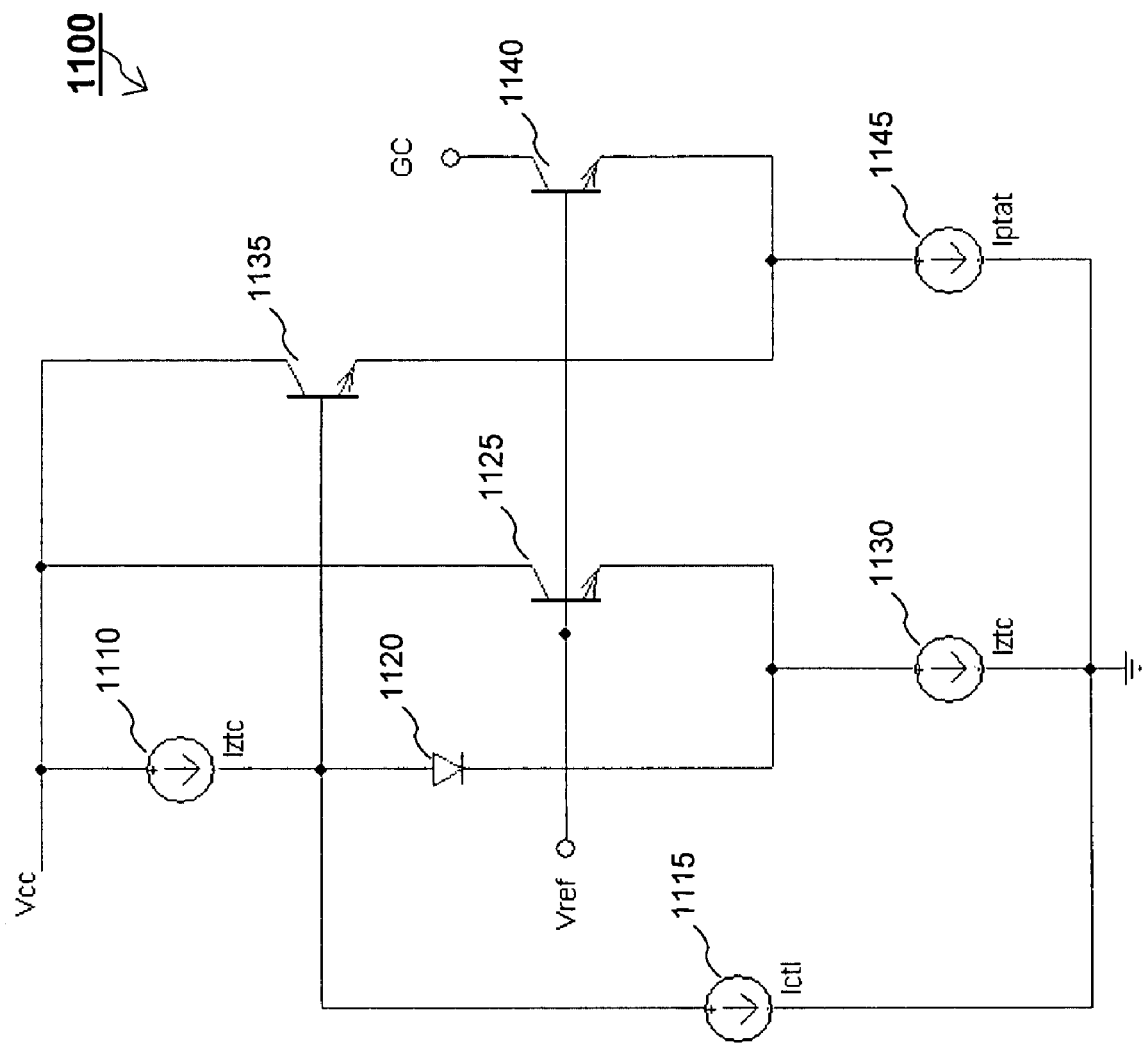
FIG. 11 depicts an exemplary circuit implementation that performs gain control current compensation in proportion of absolute temperature to achieve temperature independence of VGA gain.

Although a gain control current, e.g., GC 1092, is generally considered temperature independent, it is often affected by temperature, which makes an underlying VGA temperature dependent. This is illustrated in equation (4) and (11). Therefore, it is desirable to compensate a gain control current so that it is temperature independent or proportional to an absolute temperature (PTAT). FIG. 11 depicts an exemplary temperature compensation circuit designed to perform gain control current compensation to improve temperature independence of a VGA. In FIG. 11, $I_{ctl}$ 1115 is a control current source that may be derived from a variable gain control voltage setting and is independent of temperature. Coupled in series between source terminals Vcc and ground are zero-temperature-coefficient DC current sources $I_{ztc}$ 1110 and base-emitter connected diode 1120. Transistor 1125 is coupled between Vcc and $I_{ztc}$ 1130. In addition, coupled between Vcc and ground are transistor 1135 and current source $I_{ptat}$ 1145, which is proportional to an absolute temperature. The base of transistor 1135 is coupled to the junction between current source $I_{ctl}$ 1115 and diode 1120. Transistor 1140 is coupled to current source $I_{ptat}$ 1145. The bases of transistors 1125 and 1140 are coupled to a voltage reference. Transistor 1140 produces a current source GC that is coupled to the gain control of a VGA.

If the base current of transistor 1135 is negligible in comparison to the other circuit currents, the voltage difference between the bases transistors 1135 and 1140 should closely follow the voltage difference between the bases of diode 1120 and transistor 1125. The circuit shown in FIG. 11 linearly converts the temperature-independent gain control current $I_{ctl}$ to PTAT-dependent current GC with current gain amplification that can be derived as follows:

$$V_{be1120} - V_{be1125} = V_{be1135} - V_{be1140}$$

$$(I_{ztc} - I_{ctl})/I_{ctl} = (I_{ptat} - GC)/GC$$

$$GC = I_{ctl} * I_{ptat}/I_{ztc}$$

Where $V_{be1120}$, $V_{be1125}$, $V_{be1135}$, $V_{be1140}$ are the base emitter voltages of the associated transistors. The impact of the base current of transistor 1135 has been neglected based on the assumption that $I_{ptat}$ is on the order of $I_{ztc}$ or less. Current will vary from zero to $I_{ptat}$ when the control current $I_{ctl}$ changes from zero to $I_{ztc}$.

Figure 12:
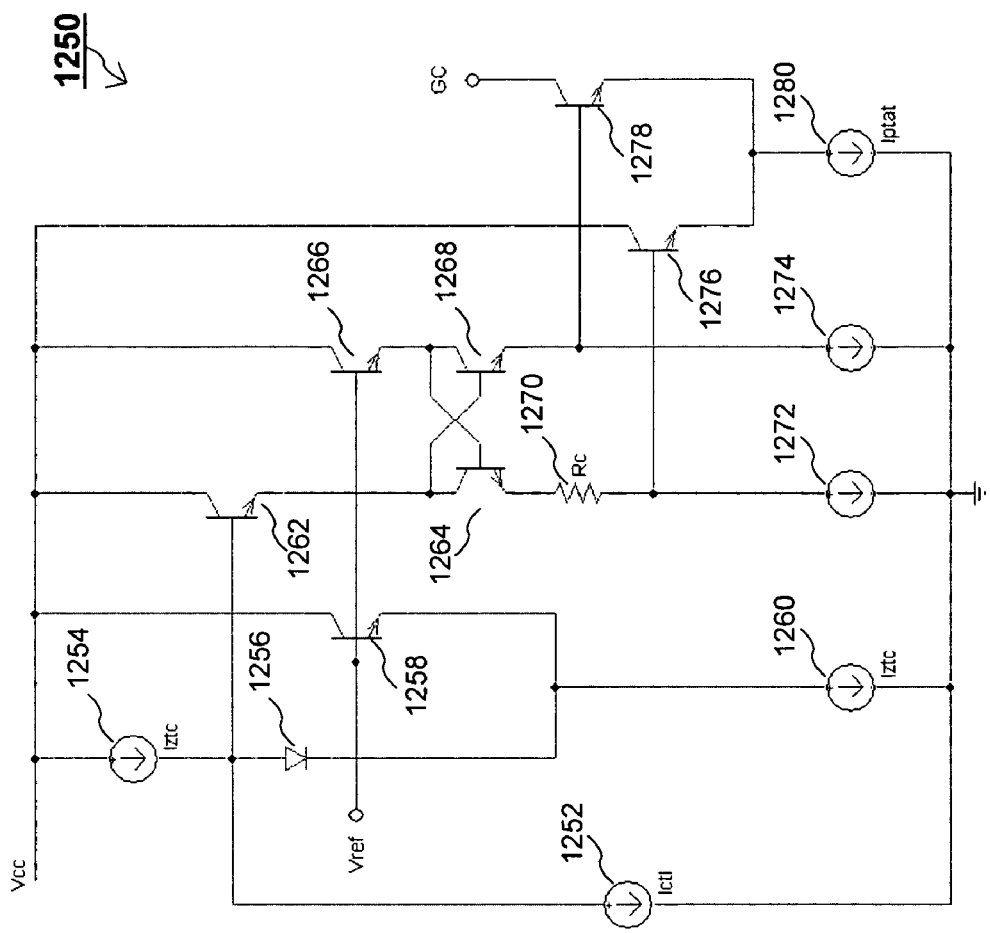
FIG. 12 depicts an alternative circuit implementation that performs gain control current compensation in proportion to absolute temperature to achieve temperature independence of the VGA gain.

When the current gain amplification is large, the base currents of transistors 1135 and 1140 become significant in comparison to $I_{ctl}$. The base current will be largest when transistor 1135 is set to $I_{ptat}$. FIG. 12 depicts an improved gain control current compensation circuit designed to reduce the effects of the base currents. In FIG. 12, emitter follower transistors 1262 and 1266 are each coupled to a current source between the supply terminals Vcc and ground. The base of transistor 1262 is coupled to the junction between current source $I_{ctl}$ 1252 and diode 1256. The emitter of transistor 1262 is coupled to the base of transistor 1268. The base of transistor 1266 is coupled to the voltage reference. A cross-coupled transistors 1264 and 1268 are placed in the conduction paths, respectively, of transistors 1262 and 1266. Resistor 1270 is coupled in series with transistor 1264. The base of transistor 1276 is coupled to resistor 1270. The cross-coupled transistors minimize voltage error, as can be appreciated by the following relationships. The translinear loop voltage relationship yields the following:

Vb1256−(Vbe1262+Vbe1268+Vb1278)=Vb1258−(Vbe1266+Vbe1264+Vb1276), Where "b" represents base voltage and "be" represents base-emitter voltage of the respective transistors. As transistor 1262 conducts the same collector current as transistor 1264, and transistor 1266 conducts the same collector current as transistor 1268, Vbe1262=Vbe1264 and Vbe1266=Vbe1268, and Vb1256−Vb1278=Vb1258−Vb1276 Or Vb1256−Vb1258=Vb1278−Vb1276.

The voltage error induced by the emitter followers caused by large base currents at transistors 1276 and 1278 is effectively eliminated by the cross-coupled transistors 1264 and 1268.

Figure 3B:
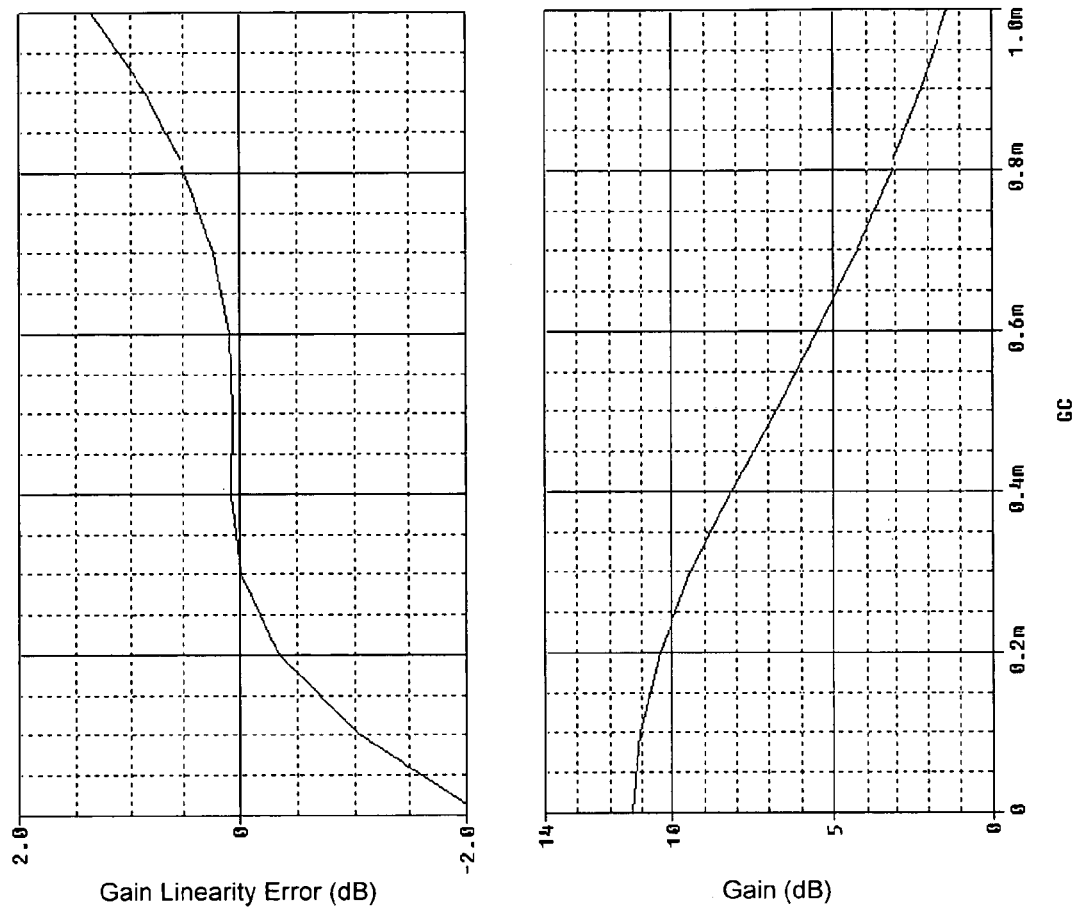
FIG. 3b (Prior Art) shows plots of linearity-in-dB and gain of a VGA with respect to gain control current.
Figure 13:
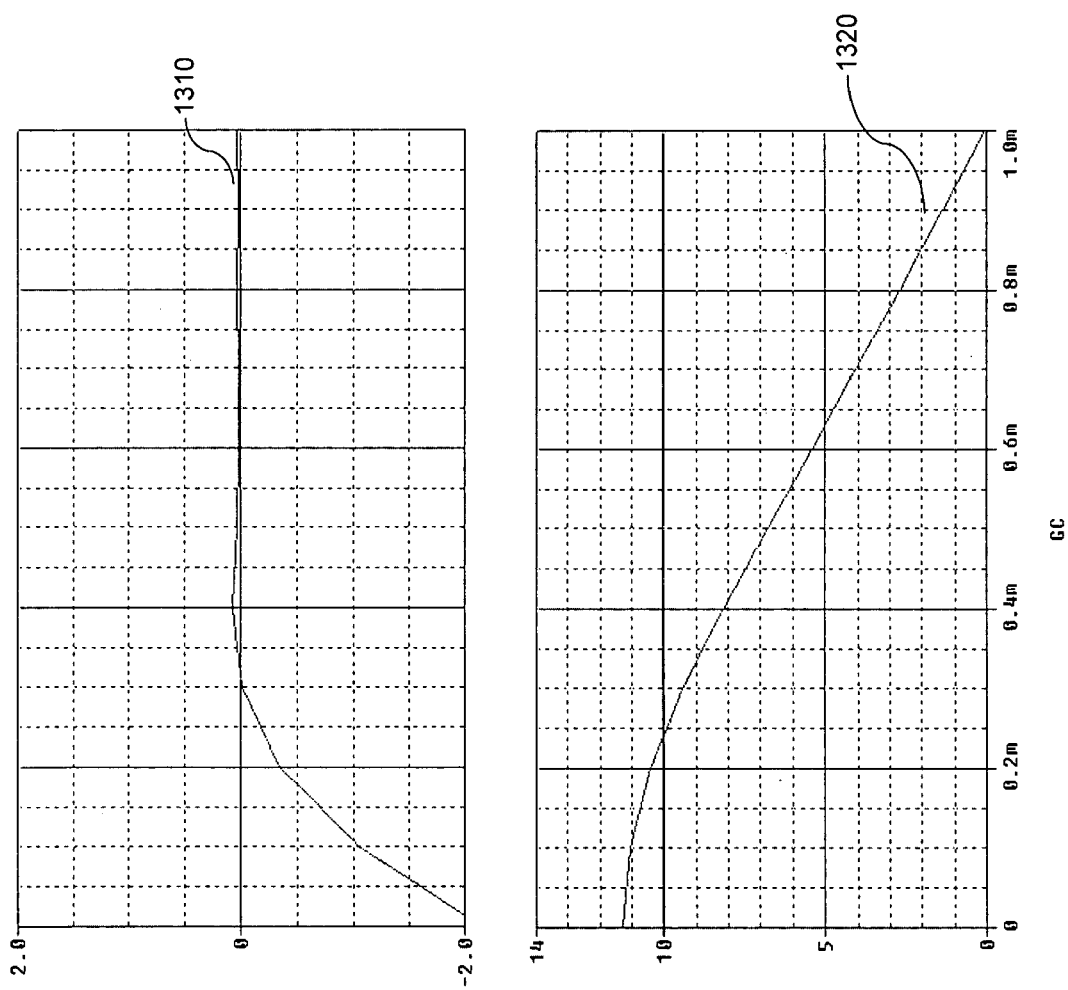
FIG. 13 shows improvement of linearity-in-dB of VGA with respect to gain control current with gain control current compensation.

The circuit in FIG. 12 also corrects for the prior art nonlinear-in-dB gain as a function of GC as exemplified in FIG. 3b. To compensate for the error shown in the range above 0.6 m of those plots, more DC current is needed to pull the gain down for the same control current. The desired linear curvature is obtained by insertion of resistor 1270 and its effect in circuit with the base resistances of transistors 1276 and 1278. Gain linearity of a VGA with temperature compensated gain control current is plotted in FIG. 13. As can be seen from the figure, there is substantially no linearity error from a GC of approximately 0.4 mA throughout the remaining range.

While the disclosure has been made with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

What is claimed is:

1. A variable gain amplifier, comprising:
   a plurality of serially connected transistor cells, wherein each of the transistor cells has a plurality of connecting terminals,
   first terminals of the transistor cells are serially coupled together to receive a first input voltage,
   second terminals of the transistor cells are serially connected, via a first set of resistors between adjacent cells, and coupled to a first gain control, each of the second terminals being coupled to an AC ground or a virtual ground,
   third terminals of the transistor cells are coupled together and to a positive current output node, and
   fourth terminals of the transistor cells are coupled together and to a negative current output node.

2. The variable gain amplifier of claim 1, wherein the first gain control is coupled to one end of the serially connected second terminals.

3. The variable gain amplifier of claim 1, wherein each of the transistor cells comprises a transistor pair.

4. The variable gain amplifier of claim 3, wherein
   the transistor pair includes first and second transistors having their emitters coupled together and to a current source;
   the base of the first transistor corresponds to the first terminal of the transistor cell;
   the collector of the first transistor corresponds to the third terminal of the transistor cell,
   the base of the second transistor corresponds to the second terminal of the transistor cell; and
   the collector of the second transistor corresponds to the fourth terminal of the transistor cell.

5. The variable gain amplifier of claim 4, wherein the current source provides a tail current of a prescribed amount.

6. The variable gain amplifier of claim 4, wherein the transistor cell further comprises a capacitor coupled to the base of the second transistor and ground to provide the AC ground or the virtual ground to the base of the second transistor.

7. The variable gain amplifier of claim 1, wherein each of the transistor cells comprises first and second transistor pairs.

8. The variable gain amplifier of claim 7, wherein
   the first transistor pair includes first and second transistors having their emitters coupled together and to a first current source;
   the base of the first transistor corresponds to the first terminal of the transistor cell;
   the collector of the first transistor corresponds to the third terminal of the transistor cell;
   the base of the second transistor corresponds to the second terminal of the transistor cell; and
   the collector of the second transistor corresponds to the fourth terminal of the transistor cell.

9. The variable gain amplifier of claim 8, wherein
   the second transistor pair includes third and fourth transistors having their emitters coupled together and to a second current source;
   the base of the third transistor is connected to a second input voltage;
   the collector of the third transistor is connected to the collector of the second transistor;
   the base of the fourth transistor is connected to the base of the second transistor; and
   the collector of the fourth transistor is connected to the collector of the first transistor.

10. The variable gain amplifier of claim 9, wherein each of the first and second current sources provides a tail current of a prescribed amount.

11. The variable gain amplifier of claim 9, wherein the first and second current sources provide currents of a same prescribed amount.

12. The variable gain amplifier of claim 1, further comprising a dynamic base current compensation unit having terminals coupled with corresponding second terminals and capable of providing a compensation current to each of the transistor cells via corresponding second terminal coupled therewith.

13. The variable gain amplifier of claim 12, wherein the dynamic base current compensation unit comprises:
   a plurality of emitter-coupled transistor pairs, each of the pairs corresponding to one of the transistor cells;
   a plurality of current sources, each corresponding to one of the emitter-coupled transistor pairs and coupled to the coupled emitters of the pair; and
   a second set of resistors corresponding to the first set of resistors and having substantially the same resistance, respectively, as that of a corresponding resistor in the first set of resistors, wherein
   the bases of first transistors of the emitter-coupled transistor pairs are serially connected via the second set of resistors between adjacent first transistors,
   the serially connected bases of the first transistors is coupled, at one end, to a second gain control that has the same setting as the first gain control and, at the other end, to a reference voltage, the collectors of the first transistors of the emitter-coupled transistor pairs are serially coupled, the bases of second transistors of the emitter-coupled transistor pairs are serially coupled to an AC ground or a virtual ground, and the collectors of second transistors of the emitter-coupled transistor pairs are respectively coupled to corresponding second terminals of the transistor cells.

14. The variable gain amplifier of claim 13, wherein each of the current sources provides a tail current in an amount that is twice Iptat/beta, where Iptat is a tail current provided by an individual current source in each of the transistor cells and beta characterizes transistors in the transistor cells.

15. The variable gain amplifier of claim 12, wherein the dynamic base current compensation unit comprises:
   a plurality of cross-coupled transistor pairs, each of the pairs corresponding to one of the transistor cells;
   a plurality of current sources, each of which corresponding to one of the cross-coupled transistor pairs and connecting to coupled emitters of the corresponding cross-coupled transistor pair, wherein
   collectors of first transistors of the cross-coupled transistor pairs are serially connected to receive a voltage reference, and
   collectors of second transistors of the cross-coupled transistor pairs are coupled to the second terminals of corresponding transistor cells, respectively.

16. The variable gain amplifier of claim 15, wherein each of the current sources provides a tail current in an amount that is twice Iptat/beta, where Iptat is a tail current provided by an individual current source in each of the transistor cells and beta characterizes transistors in the transistor cells.

17. The variable gain amplifier of claim 1, wherein the first gain control provides a temperature compensated gain control current.

18. A variable gain amplifier, comprising:
   a plurality of serially connected transistor cells; and
   a dynamic base current compensation unit having a plurality of components, each of which corresponds to a respective one of the transistor cells, wherein
   the serially connected transistor cells receive a first input voltage,
   the transistor cells are coupled to a first gain control, a positive current output node, and a negative current output node, and
   each of the transistor cells is coupled to a corresponding component in the dynamic base current compensation unit to receive a dynamically compensated base current.

19. The variable gain amplifier of claim 18, wherein
   each of the transistor cells has a plurality of connecting terminals,
   first terminals of the transistor cells are serially coupled together to receive the first input voltage,
   second terminals of the transistor cells are serially connected, via a first set of resistors between adjacent cells, and coupled to the first gain control, each of the second terminals being coupled to an AC ground or a virtual ground,
   third terminals of the transistor cells are coupled together and to the positive current output node, and
   fourth terminals of the transistor cells are coupled together and to the negative current output node.

20. The variable gain amplifier of claim 18, wherein each of the transistor cells comprises a transistor pair.

21. The variable gain amplifier of claim 19, wherein
   the transistor pair includes first and second transistors having their emitters coupled together and to a current source;
   the base of the first transistor corresponds to the first terminal of the transistor cell;
   the collector of the first transistor corresponds to the third terminal of the transistor cell;
   the base of the second transistor corresponds to the second terminal of the transistor cell; and
   the collector of the second transistor corresponds to the fourth terminal of the transistor cell.

22. The variable gain amplifier of claim 18, wherein each of the transistor cells comprises a first transistor pair and a second transistor pair.

23. The variable gain amplifier of claim 22, wherein
   the first transistor pair includes first and second transistors having their emitters coupled together and to a first current source, wherein
      the base of the first transistor corresponds to the first terminal of the transistor cell;
      the collector of the first transistor corresponds to the third terminal of the transistor cell;
      the base of the second transistor corresponds to the second terminal of the transistor cell, and
      the collector of the second transistor corresponds to the fourth terminal of the transistor cell; and
   the second transistor pair includes third and fourth transistors having their emitters coupled together and to a second current source, wherein
      the base of the third transistor is connected to a second input voltage,
      the collector of the third transistor is connected to the collector of the second transistor,
      the base of the fourth transistor is connected to the base of the second transistor, and
      the collector of the fourth transistor is connected to the collector of the first transistor.

24. The variable gain amplifier of claim 19, wherein the dynamic base current compensation unit comprises:
   a plurality of emitter-coupled transistor pairs, each of the pairs corresponding to one of the transistor cells;
   a plurality of current sources, each corresponding to one of the emitter-coupled transistor pairs and coupled to the coupled emitters of the pair; and
   a second set of resistors corresponding to the first set of resistors and having substantially the same resistance, respectively, as that of a corresponding resistor in the first set of resistors, wherein
   the bases of first transistors of the emitter-coupled transistor pairs are serially connected via the second set of resistors between adjacent first transistors,
   the serially connected bases of the first transistors is coupled, at one end, to a second gain control that has the same setting as the first gain control and, at the other end, to a reference voltage,
   the collectors of the first transistors of the emitter-coupled transistor pairs are serially coupled,
   the bases of second transistors of the emitter-coupled transistor pairs are serially coupled to an AC ground or a virtual ground, and
   the collectors of second transistors of the emitter-coupled transistor pairs are respectively coupled to corresponding second terminals of the transistor cells.

25. The variable gain amplifier of claim 24, wherein each the current sources provides a tail current in an amount that is twice Iptat/beta, where Iptat is a tail current provided by an individual current source in each of the transistor cells and beta characterizes transistors in the transistor cells.

26. The variable gain amplifier of claim 19, wherein the dynamic base current compensation unit comprises:
   a plurality of cross-coupled transistor pairs, each of the pairs corresponding to one of the transistor cells;
   a plurality of current sources, each of which corresponding to one of the cross-coupled transistor pairs and connecting to coupled emitters of the corresponding cross-coupled transistor pair, wherein
   collectors of first transistors of the cross-coupled transistor pairs are serially connected to receive a voltage reference, and
   collectors of second transistors of the cross-coupled transistor pairs are coupled to the second terminals of corresponding transistor cells, respectively.

27. The variable gain amplifier of claim 26, wherein each of the current sources provides a tail current in an amount that is twice Iptat/beta, where Iptat is a tail current provided by an individual current source in each of the transistor cells and beta characterizes transistors in the transistor cells.

28. The variable gain amplifier of claim 18, wherein the first gain control provides a temperature compensated gain control current.

* * * * *